United States Patent
Nakayama et al.

(10) Patent No.: US 7,574,312 B2
(45) Date of Patent: Aug. 11, 2009

(54) SEMICONDUCTOR DEVICE AND COMMUNICATIONS TERMINAL AND AUTOMOBILE HAVING THE SAME

(75) Inventors: Takeshi Nakayama, Nishinomiya (JP); Eiji Takahashi, Kashiba (JP); Yoshiyuki Saito, Katano (JP)

(73) Assignee: Panasonic Corporation, Osaka (JP)

( * ) Notice: Subject to any disclaimer, the term of this patent is extended or adjusted under 35 U.S.C. 154(b) by 344 days.

(21) Appl. No.: 11/268,662

(22) Filed: Nov. 8, 2005

(65) Prior Publication Data

US 2006/0097748 A1 May 11, 2006

(30) Foreign Application Priority Data

Nov. 8, 2004 (JP) .............................. 2004-323355

(51) Int. Cl.
*G01F 23/00* (2006.01)
(52) U.S. Cl. .......................................... 702/75; 701/47
(58) Field of Classification Search ................... 702/57, 702/60–63, 75, 188; 701/2, 22, 29, 36, 45, 701/47, 55–56
See application file for complete search history.

(56) References Cited

U.S. PATENT DOCUMENTS

| | | | | |
|---|---|---|---|---|
| 4,429,299 A | * | 1/1984 | Kabat et al. | ............ 340/310.16 |
| 5,694,335 A | * | 12/1997 | Hollenberg | ................... 726/16 |
| 6,259,972 B1 | * | 7/2001 | Sumic et al. | ................. 700/286 |
| 6,810,340 B2 | | 10/2004 | Shimazaki et al. | ............. 702/65 |
| 7,045,989 B2 | * | 5/2006 | Sakakibara et al. | ......... 320/106 |
| 7,184,866 B2 | * | 2/2007 | Squires et al. | ................. 701/33 |
| 7,254,004 B2 | * | 8/2007 | Mladenik et al. | ........... 361/93.1 |
| 7,313,467 B2 | * | 12/2007 | Breed et al. | ..................... 701/1 |

FOREIGN PATENT DOCUMENTS

JP            2002-270695         9/2002

* cited by examiner

*Primary Examiner*—Eliseo Ramos Feliciano
*Assistant Examiner*—Mary C Baran
(74) *Attorney, Agent, or Firm*—Wenderoth, Lind & Ponack, L.L.P.

(57) ABSTRACT

A semiconductor device is disclosed in which resistance to the influence of external noise on internal power source network is improved. A semiconductor device operating at any predetermined frequency among a plurality thereof, and having power source networks for supplying power from a power source to internal functional units in the semiconductor device comprises switches, a storage unit, and a control unit. The switches are provided in the power source networks, and switch ON/OFF the supply of power from the power source to the functional units. In the storage unit are mapped and stored a plurality of predetermined operating frequencies and switching information designating an ON state or an OFF state for the switches. The control unit reads, from the storage, switching information corresponding to a current operating frequency, and controls the ON/OFF switching of the switches in accordance with the read switching information.

11 Claims, 6 Drawing Sheets

| Operating frequency | Functional status information | | Switching information | |
| --- | --- | --- | --- | --- |
| | Functional units ON | Functional units OFF | Switches ON | Switches OFF |
| 400MHz | Functional status detecting unit<br>Frequency detecting unit<br>Control unit, Storage unit<br>Functional unit A<br>Functional unit B | — | SW1~SW12 | — |
| 200MHz | Functional status detecting unit<br>Frequency detecting unit<br>Control unit, Storage unit<br>Functional unit A | Functional unit B | SW1~SW6 | — |
| 10MHz | Functional status detecting unit<br>Frequency detecting unit<br>Control unit, Storage unit | Functional unit A<br>Functional unit B | — | SW1~SW12 |

| Operating frequency | Functional status information | | Switching information | |
|---|---|---|---|---|
| | Functional units ON | Functional units OFF | Switches ON | Switches OFF |
| 400MHz | Functional status detecting unit Frequency detecting unit Control unit Communications unit Output unit | Billing processing unit Authentication unit | SW1~SW12 | — |
| 200MHz | Functional status detecting unit Frequency detecting unit Control unit Authentication unit | Communications unit Output unit Billing processing unit | SW1~SW6 | SW7~SW12 |
| 10MHz | Functional status detecting unit Frequency detecting unit Control unit, Billing processing unit | Communications unit Output unit Authentication unit | — | SW1~SW12 |

Fig. 5

SEMICONDUCTOR DEVICE AND COMMUNICATIONS TERMINAL AND AUTOMOBILE HAVING THE SAME

BACKGROUND OF THE INVENTION

1. Field of the Invention

The present invention relates to a semiconductor device having resistance against the influence of external noise on internal power source networks.

2. Background Information

As a result of the rapid development of microelectronics and digital technologies in recent years, the level of integration in semiconductor devices and the speed of the operating frequencies thereof have become ever higher. However, progress in high-level integration and faster operating frequencies is handicapped by a serious problem in the form of EMS (electromagnetic susceptibility), whereby a semiconductor device is influenced by noise from outside. Noise outside the semiconductor device gets for instance into power source network that supplies power to various functional units inside the semiconductor device and is transmitted to these functional units inside the semiconductor device. The noise propagated to the functional units affects signal lines and/or elements of the functional units and gives rise to malfunctions.

The propagation of noise from outside the semiconductor device is normally caused by noise currents. Noise currents flow into wiring having low impedance. Thus, when the impedance of the power source network in the semiconductor device is lower than the impedance of the wiring in the circuitry outside the semiconductor device, noise currents from outside the semiconductor device are drawn into the power source network of the semiconductor device. When noise currents flow into the power source network in the semiconductor device, power source voltage changes, affecting thereby signal lines and/or elements of the functional units.

There is therefore a pressing need for EMS countermeasures that allow shielding semiconductor devices against the influence of external noise.

JP-2002-270695-A discloses a method for implementing EMS countermeasures while preserving high-level integration and fast operating frequency in a semiconductor integrated circuit. The method disclosed in JP-2002-270695-A comprises the following steps: First, impedance information is extracted from power source network inside and outside a targeted semiconductor integrated circuit. Next, equivalent circuitry is generated from the extracted impedance information. External noise waveforms are supplied as input data for the equivalent circuitry, and the influence of noise on the semiconductor integrated circuit is analyzed. If as a result of the analysis it is judged that the semiconductor integrated circuit is influenced by external noise, external noise is absorbed for instance by introducing capacitors in the vicinity of power source terminals of the semiconductor integrated circuit, and/or by introducing countermeasure circuitry for eliminating noise, such as low pass filters.

Semiconductor integrated circuits usually operate at a plurality of predetermined frequencies. In the method of Patent Reference 1, however, the impedance of the power source network can only be extracted when the operating frequency is highest.

The semiconductor integrated circuit may be assumed to work for instance either at an operating frequency of "1 GHz" or of "300 MHz". The impedance value of the power source network is proportional to the operating frequency, since parasitic inductance of the wiring is predominant. Thus, the impedance value of the power source network when the operating frequency is "1 GHz" is higher than the impedance value of the power source network when the operating frequency is "300 MHz". When the semiconductor integrated circuit operates at a high frequency, such as "1 GHz", some phenomena, such as clock disturbance or the like, occur in the semiconductor integrated circuit as a result of a frequency characteristic. When the impedance of the power source network is lower than the impedance value outside the semiconductor integrated circuit, as when the operating frequency is "300 MHz", the power source network in the semiconductor integrated circuit is influenced by external noise outside the semiconductor integrated circuit. Thus, in the method of JP-2002-270695-A, external noise can be suppressed by introducing countermeasure circuitry, such as a low pass filter or the like, when the operating frequency is "1 GHz"; however, the method does not always afford a stable operation or eliminate phenomena such as internal clock disturbance, etc. At the operating frequency of "300 MHz", also, because noise is absorbed by the countermeasure circuitry that is set for the "1 GHz" operating frequency, external noise cannot necessarily be efficiently suppressed.

Depending on the processing executed in the semiconductor integrated circuit, there are instances that differ as to whether suppression of external noise takes precedence over operative reliability, or whether operative reliability takes precedence over suppression of external noise. However, no technology has been proposed hitherto for changing such precedence to either requirement in accordance with the processing executed in the semiconductor integrated circuit.

Thus, it is an object of the present invention to provide a semiconductor device that allows dynamic switching between operating the semiconductor device normally, or increasing resistance against the influence of external noise on the power source network of the semiconductor device, for a plurality of operating frequencies. It is also an object of the present invention to provide a communications terminal and an automobile having such a semiconductor device.

SUMMARY OF THE INVENTION

With a view of solving the above problems, a first aspect of the present invention provides a semiconductor device operating at any predetermined frequency among a plurality thereof, and having a plurality of power source networks that supply power from a power source to functional units in the semiconductor device, comprising the unit below:

A switching unit respectively provided along the plurality of power source networks for switching ON/OFF the supply of power from the power source to the functional units A storage unit configured to map and store the plurality of predetermined frequencies and switching information designating an ON state or an OFF state of the switching unit.

A control unit configured to read from the storage unit switching information corresponding to a current operating frequency, and control the ON/OFF switching of the switching unit in accordance with the switching information that was read.

A semiconductor device that operates at a frequency of 1 GHz or of 300 MHz may be assumed. This semiconductor device has 10 power source networks that supply power from an external power source to functional units in the semiconductor device. When the semiconductor device operates at 1 GHz, the control unit carries out control so as to switch all the switching unit to an ON state, in response to switching information corresponding to the frequency "1 GHz". The impedance of the power source network drops thereupon to a lower value than when at least one switching unit among the power source networks is in the OFF state, since the 10 power source networks are connected in parallel. This consequently improves phenomena such as internal clock disturbance or the like, which occur in high-frequency bands on account of the frequency characteristic, and allows the semiconductor device to operate stably. When the semiconductor device operates at 300 MHz, 3 switching unit among the power source networks are switched to the ON state, while the other 7 switching unit are switched to the OFF state, as instructed by the control unit in response to the switching information corresponding to the frequency "300 MHz". The impedance of the power source network rises thereupon to a higher value than when there are 4 or more power source networks having switching unit in the ON state, since the above 3 power source networks are connected in parallel. The influence of external noise on the power source network of the semiconductor device can thereby be suppressed. That is, malfunctions caused by external noise can be suppressed in the semiconductor device.

A second aspect of the present invention provides a semiconductor device according to the first aspect of the present invention, wherein the switching information is set so as to keep the impedance value of the power source network within a predetermined range, for any frequency among the predetermined frequencies at which the semiconductor device operates.

Generally, the impedance value of the power source network is proportional to the frequency at which the semiconductor device operates. If operation of the device at a frequency of 1 GHz is compared with operation of the device at a frequency of 10 MHz, the impedance value of the power source network is higher when the semiconductor device operates at a frequency of 1 GHz than when the semiconductor device operates at a frequency of 10 MHz. A "predetermined range" refers herein to values within a range extending from, for instance, a predetermined impedance value lower than the impedance value of the power source network when the semiconductor device operates at a frequency of 1 GHz, to the impedance value of the power source network when the semiconductor device operates at a frequency of 10 MHz. Thus, the switching information for operation at a frequency of 1 GHz is determined so as to adjust the impedance value of the power source network so as not to exceed a predetermined value. The switching information for operation at a frequency of 10 MHz is set so as to adjust the impedance value of the power source network to be the highest value upon operation at 10 MHz. By keeping the impedance value of the power source network within a predetermined range, the semiconductor device acquires a capacity to suppress external noise, within a defined range, even when operating at different frequencies.

A third aspect of the present invention provides a semiconductor device according to the second aspect of the present invention, further comprising frequency detecting unit configured to monitor the current operating frequency and for, when the current operating frequency changes, detecting the operating frequency after the change. The control unit of the semiconductor device read, from the storage unit, switching information corresponding to the current operating frequency after change that was detected by the frequency detecting unit.

The semiconductor device operates at a frequency corresponding to the current operational situation. The ON state or OFF state of the switching unit of the power source network are controlled in accordance with the operating frequency of the semiconductor device at a given time. Therefore, the impedance of the power source network is adjusted in accordance with the frequency at a given time, so that external noise from outside the semiconductor device influencing the power source network may be suppressed, or the operation of the semiconductor device may be stabilized, in accordance with the operational situation.

A fourth aspect of the present invention provides a semiconductor device according to the second aspect of the present invention, further comprising a functional status detecting unit configured to detect functional unit status indicating the ON/OFF state of at least one functional unit. Functional status information designating the ON/OFF state of at least one functional unit is further respectively mapped to the plurality of predetermined frequencies and to the switching information, and is stored in the storage unit of the semiconductor device. The control unit of the semiconductor device, furthermore, reads switching information from the storage unit on the basis of the functional status detected by the functional status detecting unit, the functional status information stored in the storage unit, and the current operating frequency.

On the basis of the current operating frequency and the functional status information, the ON/OFF state of the switching unit are changed to adjust the impedance value of the power source network in the semiconductor device to an appropriate value. For instance, if the current operating frequency is a low-frequency one and there are numerous functional units OFF, the switching units of the semiconductor device are controlled so as to switch OFF numerous switching units. The impedance value of the power source network becomes thereby higher than the impedance value of the power source network when all the switching units are in the ON state. The influence of external noise on the semiconductor device is thereby dampened. By contrast, if the current operating frequency is a high-frequency one and there are numerous functional units ON, the switching units are controlled so as to switch ON numerous switching units. The impedance value of the power source network becomes thereby lower than the impedance value of the power source network when all the switching units are in the OFF state. As a result, phenomena such as internal clock disturbance or the like can be improved, and the semiconductor device can operate stably.

A fifth aspect of the present invention is a semiconductor device according to the fourth aspect of the present invention, wherein the functional status information is set in accordance with the criticality of the processing executed in the functional units.

For example, the semiconductor device can be assumed to operate at either "400 MHz" or "10 MHz" frequencies. The lowest frequency "10 MHz" is stored as corresponding to the functional status information indicating the ON state of the functional units where processing of "high" criticality is carried out. The storage unit then store switching information for the frequency "10 MHz", such that, when the semiconductor device operates at that frequency, the impedance of the power source network is adjusted so as to become highest. Thus, when functional units carrying out high-criticality processing are ON, the semiconductor device operates at 10 MHz, and the switching units are controlled on the basis of the switching information. The semiconductor device can therefore reliably execute high-criticality processing while suppressing the influence of external noise on the power source network.

In order to solve the aforementioned problems, a sixth aspect of the present invention further provides a communications terminal characterized by comprising the semiconductor device according to the first aspect of the present invention, for communicating with other terminals via a communications network. The semiconductor device comprises, as one of the functional units, a communications unit whereby the communications terminal communicates with other terminals.

In the semiconductor device of the first aspect of the present invention, the state of the internal power source network is changed on the basis of the current operating frequency, so as to adjust the impedance of the power source network to an appropriate value. The influence of noise outside the semiconductor device upon the power source network is thereby suppressed. The semiconductor device according to the first aspect of the present invention may thus be used as a semiconductor device in a communications terminal. For instance, if high-criticality processing such as billing processing is processed on the communications terminal, the frequency in the semiconductor device is lowered and the ON/OFF states of the switching unit are switched so as to increase the wiring impedance of the power source. The influence of noise outside the semiconductor device upon the power source network is thereby suppressed while processing is being executed. The communications terminal can thus execute processing reliably and without malfunction.

In order to solve the aforementioned problems, a seventh aspect of the present invention provides an automobile having on-board equipment comprising the semiconductor device according to the first aspect of the present invention. The semiconductor device comprises, as one of the functional units, an output unit for outputting signals for controlling the on-board equipment.

In the semiconductor device of the first aspect of the present invention, the state of the power source network is changed on the basis of the operating frequency so as to adjust the impedance of the power source network to an appropriate value. The influence of noise outside the semiconductor device upon the power source network is thereby suppressed. The semiconductor device according to the first aspect of the present invention may thus be used as a semiconductor device for controlling various devices installed in an automobile. As a result, the power source network in the semiconductor device remains unaffected even by electromagnetic fields emanating from on-board equipment, for instance from an engine or the like. The operation of the semiconductor device is thus trouble-free. The automobile having the semiconductor device according to the first aspect of the present invention is therefore safe, with no malfunctions or the like.

The present invention allows a semiconductor device to operate normally or allows increasing resistance against the influence of external noise on the power source network of a semiconductor device, for a plurality of operating frequencies.

These and other objects, features, aspects and advantages of the present invention will become apparent to those skilled in the art from the following detailed description, which, taken in conjunction with the annexed drawings, discloses a preferred embodiment of the present invention.

BRIEF DESCRIPTION OF THE DRAWINGS

Referring now to the attached drawings which form a part of this original disclosure:

FIG. 2 is a switching information table stored in a storage unit according to the first embodiment.

FIG. 5 is a switching information table stored in the storage unit in an example.

DETAILED DESCRIPTION OF THE PREFERRED EMBODIMENTS

First Embodiment

Figure 1:
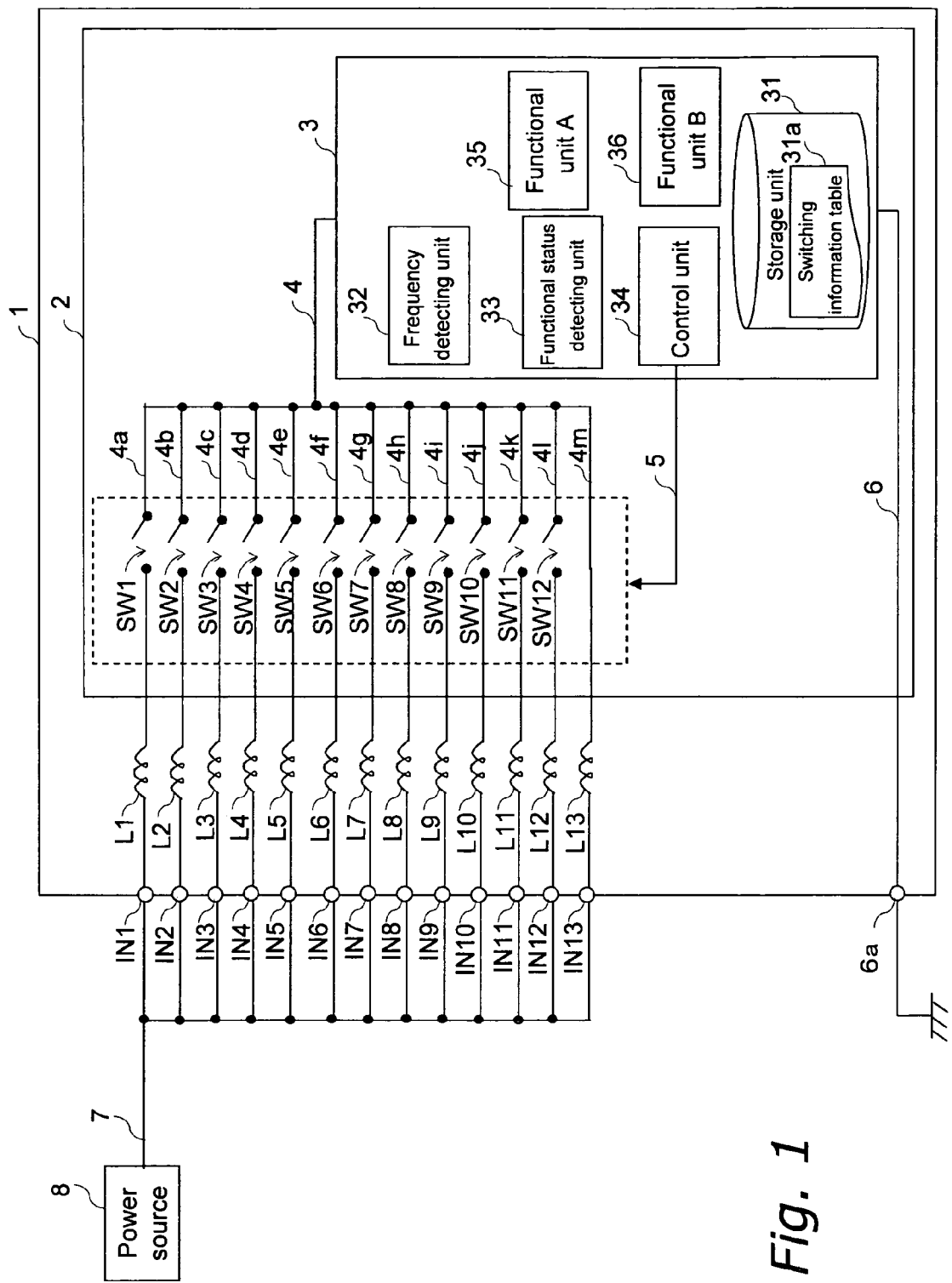
FIG. 1 is a diagram illustrating the overall constitution of a semiconductor device according to a first embodiment and the connections thereof with peripheral devices.

FIG. 1 is a diagram illustrating the overall constitution of a semiconductor device according to a first embodiment and the connections thereof with peripheral devices. This semiconductor device is used as a semiconductor device for controlling, for example, cellular telephones, communications terminals such as on-board ETC (Electronic Toll Collection) systems, various devices in automobiles or the like. The semiconductor device 1 in FIG. 1 is connected to an external power source 8 through a wiring 7. The power source 8 supplies power to the semiconductor device 1.

(1) Constitution of the Semiconductor Device

The semiconductor device 1 of FIG. 1 comprises a printed circuit board 2, with circuitry printed thereon, and a semiconductor package covering the former. The semiconductor package comprises a plurality of input terminals IN1-IN13 and a GND terminal 6a.

On the printed circuit board 2 is provided circuitry comprising a functional unit group 3, comprised of various functional units 31-36, a power source network 4, and switches SW1-SW12 (which correspond to switching unit). The functional units 31-36 in the functional unit group 3 are explained below. The power source network 4 connects the functional unit group 3 with the switches SW1-SW12. Specifically, one power source network 4 extending from the connection side of the functional unit group 3, braches out and connects to one terminal each of the switches SW1-SW12. The branched power source network 4 will be referred to hereinafter as "the branch wirings $4a$-$4m$". The switches SW1-SW12 are connected in parallel by the branch wirings $4a$-$4l$. The other terminals of the switches SW1-SW12 are connected to the input terminals IN1-IN12 of the semiconductor package. The switches SW1-SW12 switch ON/OFF the supply of power to the functional units 31-36, from the power source 8, which is external to the semiconductor device 1. The branch wiring $4m$ comprises no switch and is thus directly connected to an input terminal IN13. Accordingly, power from the power source 8 is supplied via the branch wiring $4m$ to the functional units 31-36, even when all the switches SW1-SW12 are switched OFF. The method for connecting the other terminals of the switches SW1-SW12 to the input terminals of the semiconductor package may be for instance a wire-bonding method, a wireless-bonding method or the like. In the present embodiment, for instance, wire bonding is used. Specifically, the switches SW1-SW12 and the input terminals IN1-IN12, and the branch wiring $4m$ and the input terminal IN13, are connected by wires. In FIG. 1, L1-L12 are inductances of the wires connecting the switches SW1-SW12 and the input terminals IN1-IN12. L13 is the inductance of a wire connecting the branch wiring $4m$ and the input terminal IN13.

On the printed circuit board 2 is further provided a wiring 5 and a wiring 6. The wiring 5 connects the switches SW1-SW12 to a control unit 33, described below, in the functional unit group 3. The wiring 6 connects the functional units 31-36 in the functional unit group 3 to the GND terminal 6a of the semiconductor package. The GND terminal 6a is connected to a ground outside the semiconductor device 1.

(2) Constitution of the Functional Unit Group

The constitution of the functional unit group 3 is explained next. The functional unit group 3 comprises a storage unit 31, a frequency detecting unit 32, a functional status detecting unit 33, a control unit 34, a functional unit A 35, and a functional unit B 36. The functional unit A 35 and the functional unit B 36 have arbitrary functions. The main functional units are explained next.

(2-1) Storage Unit

FIG. 2 is a diagram illustrating the concept of a switching information table 31a stored in the storage unit 31. An operating frequency, functional status information, and switching information are stored as one record in the switching information table 31a of FIG. 2. The operating frequency is the predetermined frequency at which the semiconductor device 1 operates. The switching information is information designating the ON-state or OFF-state of the switches SW1-SW12. The functional status information is information designating the ON/OFF state of at least one functional unit.

For instance, the functional status information corresponding to operating frequency "200 MHz" designates an OFF state only for the functional unit B 36, and an ON state for the other functional units 31-35. The corresponding switching information designates that the switches SW1-SW6 are ON, while the other switches SW7-SW12 are OFF. The method for setting the switching information in the switching information table 31a is described below.

Though functional status information is stored in the switching information table 31a of FIG. 2, functional status information becomes unnecessary if the ON/OFF of each functional unit 31-36 is coupled with the operating frequency of the semiconductor device 1. At least the operating frequency and the switching information should be mapped and recorded in the switching information table 31a.

(2-2) Frequency Detecting Unit

The frequency detecting unit 32 monitors the current operating frequency of the semiconductor device 1. When the operating frequency changes, the frequency detecting unit 32 detects the operating frequency after change and transmits it to the control unit 34.

(2-3) Functional Status Detecting Unit

The functional status detecting unit 33 detects a functional unit status indicating the ON/OFF state of at least one functional unit in the functional unit group 3. The functional status detecting unit 33 notifies the control unit 34 of the detected ON/OFF state of the functional unit(s).

(2-4) Control Unit

Upon receiving the current operating frequency detected by the frequency detecting unit 32, and the functional status detected by the functional status detecting unit 33, the control unit 34 searches the switching information table 31a for the corresponding operating frequency and functional status information. The control unit 34 reads the switching information hits resulting from the search. The control unit 34 then controls the ON/OFF switching of the switches SW1-SW12 in accordance with the switching information that has been read. Specifically, the control unit 34 generates, on the basis of the switching information that has been read, a signal for controlling the switches SW1-SW12, which is sent via the wiring 5 to the switches SW1-SW12.

The control unit 34 may also control the switches SW1-SW12 by reading from the switching information table 31a the switching information corresponding to the operating frequency after a change.

(3) Method for Setting the Switching Information

The method for setting the switching information in the switching information table 31a of FIG. 2 is described next. The switching information is set in such a way that the value of the total impedance of the entirety of the branch wirings 4a-4m falls within a predetermined range, regardless of the operating frequency at which the semiconductor device 1 operates. The entirety of the branch power source networks 4a-4m will be referred to hereinafter as "the entire power source network".

Impedance Z in each of the branch wirings 4a-4m can ordinarily be derived from the formula below, assuming that parasitic impedance of the wiring is predominant:

$$Z = 2\pi f L$$

L is the inductance value per wiring of the branch wirings 4a-4m, mainly the inductance value of the wires. The value of L varies depending on the type of wires used, among other factors. In the present embodiment the inductance L is assumed to be 1nF.

f is the frequency of an odd harmonic of the operating frequency. The reason for using harmonic frequencies for f is briefly explained. An internal clock for operating the functional units 31-36 is generated in the semiconductor device 1. The internal clock is generated through charge and discharge of electrical currents flowing through the power source network 4 to capacitors provided inside the semiconductor device 1. These currents contain frequency components of the operating frequency of the generated internal clock, and/or frequency components of even harmonics of the operating frequency. Among frequency components in the currents, the frequency components of odd harmonics of the operating frequency, in particular, are large enough that they cannot be neglected. For this reason, odd harmonic frequencies of the operating frequency are used for f in the above formula when determining the inductance value per wiring in the branch wirings 4a-4m. In the present embodiment, for instance, a $5^{th}$ harmonic of the operating frequency is used as f.

First, the impedance Z per wiring of the branch wirings 4a-4m is calculated based on the above formula for each operating frequency in the switching information table 31a at which the semiconductor device 1 operates. If the operating frequency is "400 MHz", the frequency f of the $5^{th}$ harmonic is "2 GHz". The impedance Z per wiring of the branch wirings 4a-4m is thus "12.56 Ω". Similarly, when the operating frequency is "200 MHz" and "10 MHz", the impedance Z per wiring of the branch wirings 4a-4m is "6.28 Ω" and "0.314 Ω", respectively.

The number of necessary branch wirings 4a-4m is next calculated on the basis of the impedance Z per wiring of the branch wirings 4a-4m calculated above, with a view of keeping the impedance of the entire power source network 4, for each operating frequency, within a predetermined range. The "predetermined range" herein is set to impedance values that allow the influence of noise from outside the semiconductor device 1 to be suppressed, even at the lowest operating frequency of "10 MHz", and that afford correct operation also at the highest operating frequency of "400 MHz", with no internal clock disturbance. In the present embodiment the predetermined range is "1 Ω to 0.314 Ω". The number of necessary branch wirings 4a-4m is adjusted so as to keep the impedance of the entire power source network 4 within 1 Ω to 0.314 Ω, for each operating frequency.

For instance, if the impedance Z of one of the branch wirings 4a-4m is "R", the total impedance of n branch wirings 4a-4m connected in parallel, i.e., the impedance of the entire power source network 4, is "R/n". To keep the impedance of the entire power source network 4 at or below 1 Ω, there must be at least R branch wirings 4a-4m (n≧R). Specifically, when the operating frequency is "400 MHz", the impedance Z per wiring of the branch wirings 4a-4m is "12.56 Ω", and in consequence at least 13 branch wirings 4a-4m are required for the impedance of the entire power source network 4 to be 1 Ω or less. Similarly, when the operating frequency is "200 MHz", at least 7 branch wirings 4a-4m are required. When the operating frequency is "10 MHz", the impedance Z per wiring of the branch wirings 4a-4m is "0.314 Ω". By connecting in parallel one or more branch wirings 4a-4m, the impedance of the entire power source network 4 thus becomes less than "0.314 Ω". Accordingly, the branch wirings 4a-4m can be then reduced to one wire. In the present embodiment the number of necessary branch wirings 4a-4m is kept to a minimum. That is, 13 branch wirings 4a-4m are required for an operating frequency of "400 MHz", and 7 branch wirings 4a-4m for an operating frequency of "200 MHz".

Switching information is set on the basis of the number of necessary branch wirings 4a-4m determined as explained above. Since 13 branch wirings 4a-4m are required for an operating frequency of "400 MHz", the switching information designates in this case an ON state for all the switches SW1-SW12. Similarly, the switching information for an operating frequency of "200 MHz" designates for instance an ON state for the switches SW1-SW6, and an OFF state for the switches SW7-SW12. The switching information for an operating frequency of "10 MHz" designates an OFF state for all the switches SW1-SW12. That is so because no switch is provided on the single branch wiring 4m.

The ON/OFF state of the switches SW1-SW12 is changed in the semiconductor device 1 on the basis of the frequency and the status of the functional units 31-36, in such a way as to keep the impedance of the entire power source network 4 within a predetermined range, for any operating frequency of the semiconductor device 1. This confers the semiconductor device 1 a capability of restricting external noise to a suitable range, for any operating frequency among a plurality thereof at which the semiconductor device 1 is operating. The semiconductor device 1 can therefore suppress malfunctions caused by external noise. When the operating frequency is high, in particular, the impedance per wiring of the branch wirings 4a-4m increases, and the impedance of the entire power source network 4 is thus lowered by switching ON the switches in the branch wirings 4a-4m. Consequently, at high operating frequencies, the semiconductor device 1 can operate stably, improving among other phenomena internal clock disturbance, resulting from the frequency characteristic.

EXAMPLES

Next, an example of the above first embodiment of the semiconductor device used in a communications terminal is described. The communications terminal in the present example communicates with other terminals via a communications network. The present example relates to a communications terminal in which billing and/or authentication processing is carried out.

(1) Constitution of the Communications Terminal and the Semiconductor Device

Figure 3:
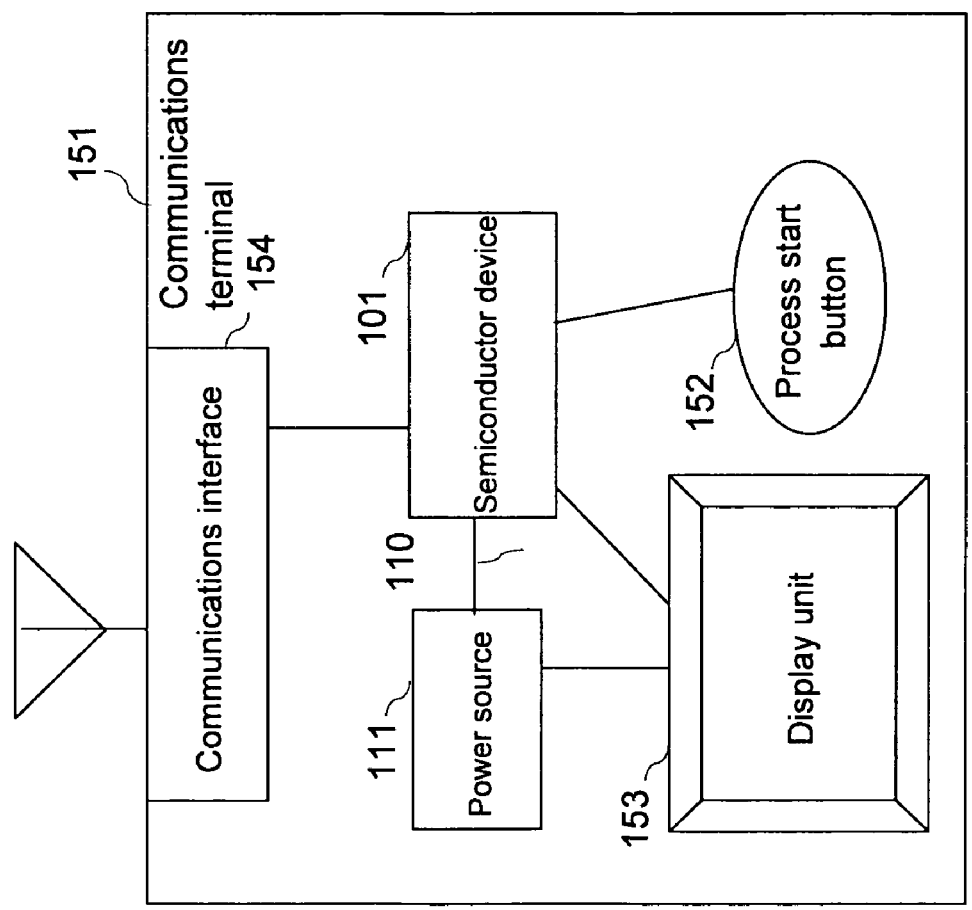
FIG. 3 is a block diagram of a communications terminal in an example.

FIG. 3 is a block diagram of a communications terminal 151 according to the present embodiment. The communications terminal 151 in FIG. 3 comprises a process start button 152, a display unit 153, a communications interface 154, a semiconductor device 101, and a power source 111. The process start button 152 receives, from the user, instructions for executing billing and/or authentication processing. Progress and results of the billing/authentication process being executed are displayed in the display unit 153. The semiconductor device 101 controls and processes communications with the other terminals via the communications interface 154. The power source 111 supplies power to the semiconductor device 101 and the display unit 153.

Figure 4:
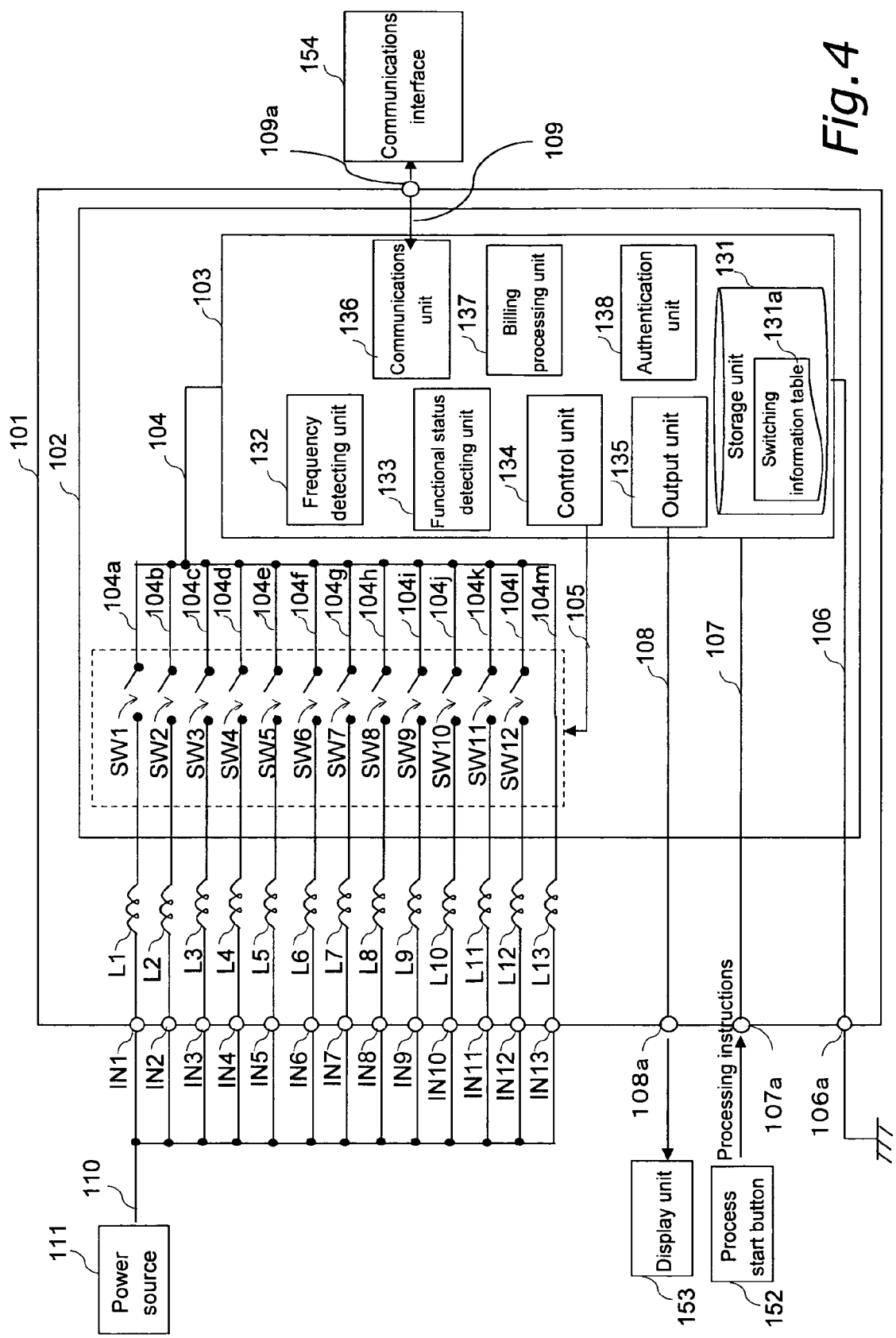
FIG. 4 is a connection diagram of a semiconductor device in an example and a wiring diagram thereof with peripheral devices.

FIG. 4 is a diagram illustrating the overall constitution of a semiconductor device 101 according to the present example and the connections thereof with peripheral devices. The semiconductor device 101 further comprises wirings 107-109 and I/O terminals 107a-109a. The wiring 107 connects the process start button 152 with a functional group 103 described below, and processing instructions for the functional group 103 are input to the input terminal 107a. The wiring 108 connects the display unit 153 to an output unit 135 described below, and the output signals of the output unit 135 are outputted through an output terminal 108a. The wiring 109 connects a communications unit 136 described below with the communications interface 154, with signals being input/output between the communications unit 136 and the communications interface 154 via an I/O terminal 109a.

The rest of the overall constitution of the semiconductor device 101 is identical to that of the first embodiment. That is, the semiconductor device 101 comprises a printed circuit board 102 and a semiconductor package provided thereon. On the printed circuit board 102 is provided circuitry comprising a functional unit group 103 that comprises various functional units 131-138, a power source network 104, and switches SW1-SW12. On the semiconductor package are provided input terminals IN1-IN13 and a GND terminal 106a. The power source network 104 is branched to connect the functional unit group 103 with one terminal of each switch SW1-SW12. The branched power source network 104 will be referred to hereinafter as "the branch wirings 104a-104m". The switches SW1-SW12 are connected in parallel by the branch wirings 104a-1041. The other terminals of the switches SW1-SW12 are connected by wires to the input terminals IN1-IN12 of the semiconductor package. The branch wiring 104m is connected directly to the input terminal IN13. The input terminals IN1-IN13 are connected through a wiring 110 with the power source 111 outside the semiconductor device 101. On the printed circuit board 102 are further provided a wiring 105 and a wiring 106. The wiring 105 connects a control unit 134, described below, with the switches SW1-SW12. The wiring 106 connects the functional units 131-138 in the functional unit group 103 to the GND terminal 106a of the semiconductor package. The GND terminal 106a is connected to a ground, which is exterior to the semiconductor device 101.

(2) Constitution of the Functional Unit Group

The constitution of the functional unit group 103 is explained next. The functional unit group 103 comprises a storage unit 131, a frequency detecting unit 132, a functional status detecting unit 133, a control unit 134, an output unit 135, a communications unit 136, a billing processing unit 137 and an authentication unit 138. The output unit 135, the communications unit 136, the billing processing unit 137 and the authentication unit 138 in the semiconductor device 101 of the present example correspond to the functional unit A 35 and the functional unit B 36 of the functional unit group 3 in the first embodiment.

In the storage unit 131 is stored a switching information table 131a. FIG. 5 is conceptual diagram illustrating the switching information table 131a. As in the switching information table of FIG. 2, the operating frequency, functional state information and switching information are stored as one record in the switching information table 131a of FIG. 5. For instance, the functional status information for the operating frequency "10 MHz" indicates that the billing processing unit 137 is ON, while the output unit 135, the communications unit 136 and the authentication unit 138 are OFF. It should be noted that the frequency detecting unit 132, the functional status detecting unit 133 and the control unit 134 are always ON. The switching information for this case designates an OFF state for all the switches SW1 -SW12.

The frequency detecting unit 132 monitors the operating frequency at which the semiconductor device 101 is currently operating; if the operating frequency changes, the frequency detecting unit 132 detects the operating frequency after the change.

The functional status detecting unit 133 detects a functional status indicating the ON/OFF state of the functional units 131-138 in the functional unit group 103.

On the basis of the current operating frequency and the functional status detected by the frequency detecting unit 132 and the functional status detecting unit 133, respectively, the control unit 134 reads switching information from the switching information table 131a stored in the storage unit 131. The control unit 134 controls the switches SW1-SW12 based on the switching information that has been read.

The output unit 135 outputs the progress and results of the processing being executed in the billing processing unit 137 and the authentication unit 138.

The communications unit 136 sends and receives data to and from other terminals via a communications network.

The billing processing unit 137 executes billing processing upon receiving a billing processing instruction from the process start button 152.

The authentication unit 138 executes authentication processing upon receiving an authentication processing instruction from the process start button 152.

(3) Relationship Between Processing and Functional Status Information

The relationship between the functional status information and the operating frequency in the switching information table 131a of FIG. 5 is described next. The functional status information in the switching information table 131a of the present example is set in accordance with the criticality of processing being executed in the functional units.

For instance, billing processing may be assumed to be of "high" criticality as a communications processing standard. In the present example, "high-criticality" billing is processed at the lowest operating frequency "10 MHz" so as to execute the process reliably and avoid malfunctions caused by noise from outside the semiconductor device 101. When the operating frequency is "10 MHz", all the switches SW1-SW12 are switched OFF to yield a single branch wiring. The impedance of the entire power source network 104 becomes maximal when the operating frequency is "10 MHz". The semiconductor device 101 can thus suppress external noise and execute malfunction-free billing processing.

It should be noted that the switching information is set for each operating frequency, in the same way as in the first embodiment.

The functional status information is established in accordance with the criticality of the processing performed by the functional units that are ON. High-criticality processing is carried out for instance at a low operating frequency. In such a case, the impedance of the entire power source network 104 is lower than the impedance of the entire power source network 104 when processing is carried out at a high operating frequency; when the operating frequency is low, processing is carried out with the highest impedance of the entire power source network 104. The semiconductor device 101 can therefore execute processing reliably, suppressing the influence that noise outside the device has on the power source network.

In general, the power consumed in the semiconductor device 101 is proportional to the square of the operating frequency. Power consumption in the semiconductor device 101 can be reduced, therefore, by lowering the operating frequency thereof. As a result, the semiconductor device 101 according to the present invention can be incorporated into a communications terminal 151 that requires low power consumption. The entire power consumption of the communications terminal 151 can thus be lowered.

OTHER EXAMPLES (A)

Figure 6:
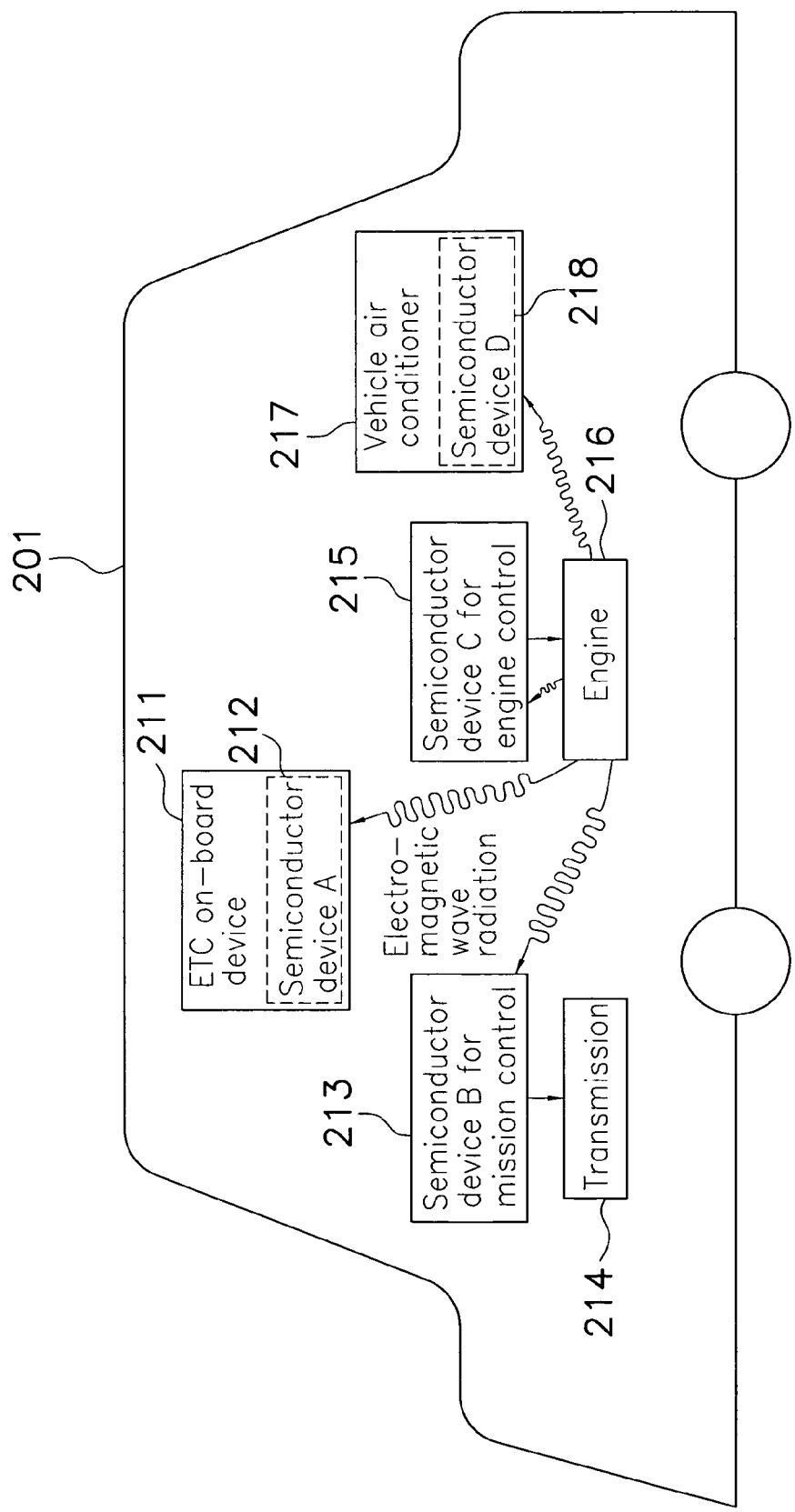
FIG. 6 is a conceptual diagram of a semiconductor device according to another example used in an automobile.
Figure 1:
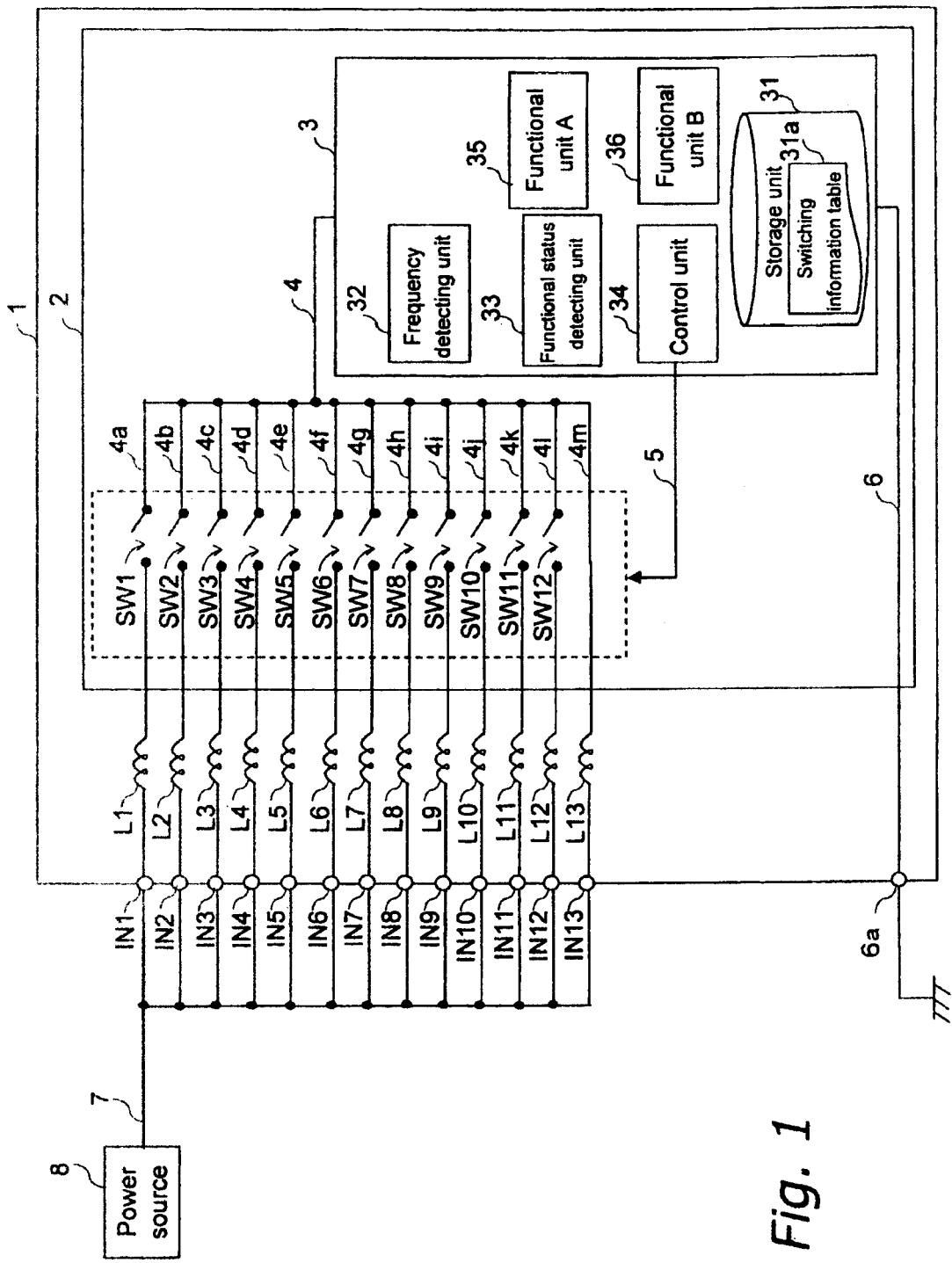
Figure 3:
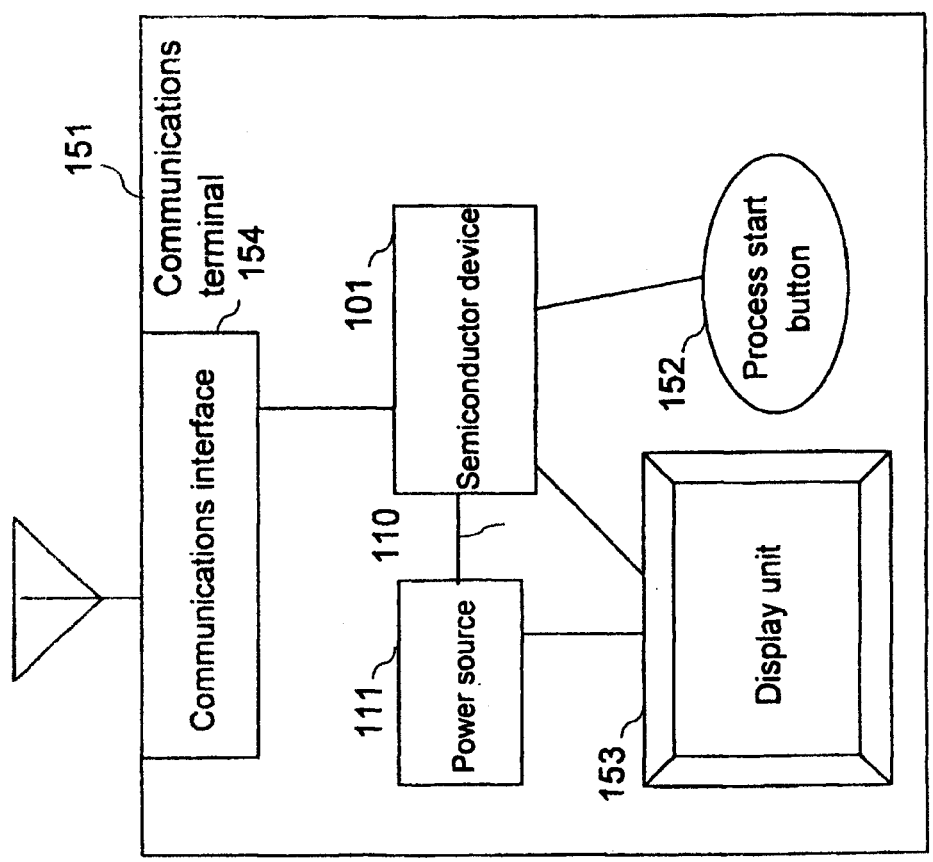
Figure 4:
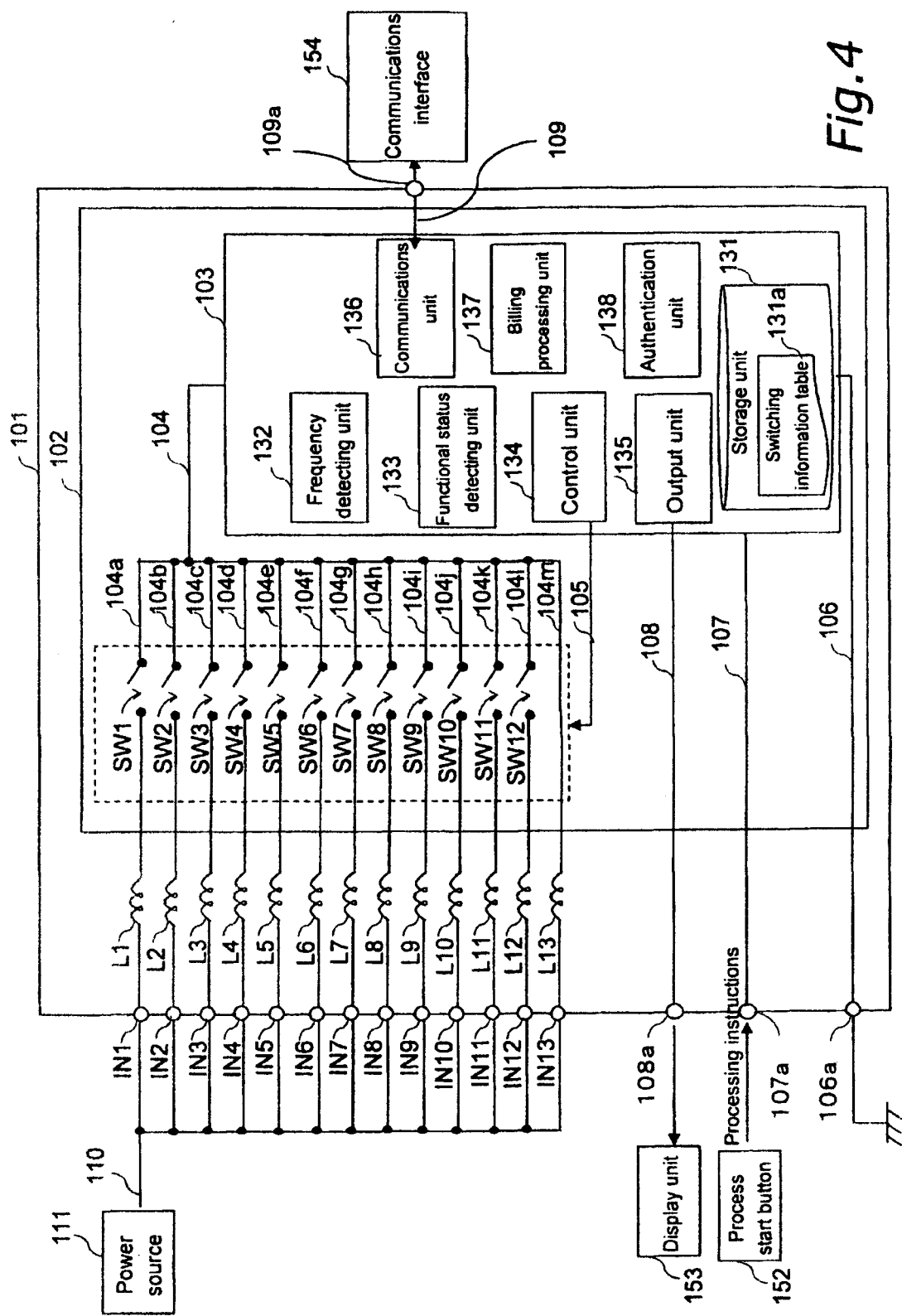
Figure 6:
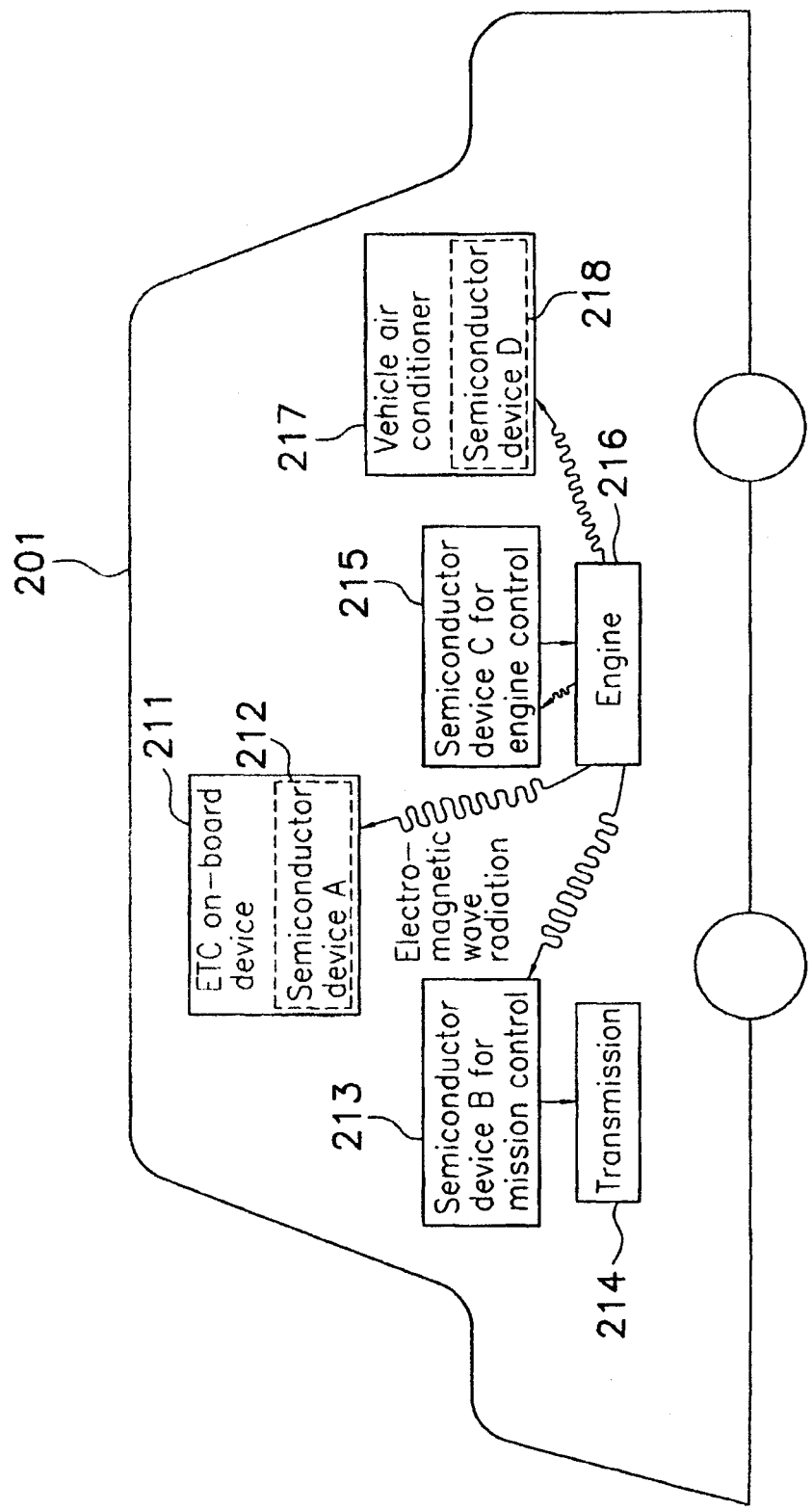

FIG. 6 is a conceptual diagram of the constitution of functional units in an automobile, using as semiconductor devices installed in the automobile the semiconductor device 1 according to the first embodiment of the present invention. An automobile 201 in FIG. 6 has an ETC on-board device 211, a transmission 214, an engine 216 and a vehicle air conditioner 217. The semiconductor devices A 212 and D 218 of the first embodiment are installed respectively on the ETC on-board device 211 and the vehicle air conditioner 217. The automobile 201 comprises also a semiconductor device B 213 for mission control and a semiconductor device C 215 for engine control according to the first embodiment. Semiconductor devices A-D 212, 213, 215, 218 comprise outputs units for outputting signals for controlling the ETC on-board device 211, the transmission 214, the engine 216, and the vehicle air conditioner 217, respectively.

The engine 216 radiates strong electromagnetic fields, and therefore the semiconductor devices A-D 212, 213, 215, and 218 are used so that the power source network in the semiconductor devices is little affected by the electromagnetic fields radiated by the engine 216. The semiconductor devices A-D 212, 213, 215, and 218 can thus operate stably and can output signals for controlling the various devices. An automobile that incorporates the semiconductor device 1 of the first embodiment is thus safe and malfunction-free.

(B)

In the first embodiment, the control unit 34 controls the switches SW1-SW12, but it may also control the ON/OFF switching of the functional units 31-36 in addition to the control of the switches SW1-SW12. On the basis of the current operating frequency as detected by the frequency detecting unit 32, the control unit 34 may then additionally read the corresponding functional status information from the switching information table 31a.

In addition to controlling the switches SW1-SW12, the control unit 34 may also change the operating frequency. On the basis of the ON/OFF state of the functional units 31-36 as detected by the functional status detecting unit 33, the control unit 34 may then additionally read the corresponding frequency from the switching information table 31a. It should be noted that the timing at which the functional status detecting unit 33 starts detecting the ON/OFF state of the functional units 31-36 may be, for instance, the timing at which processing instructions are received from the device in which the semiconductor device 1 is installed.

(C)

In the first embodiment and the examples, the functional units in the functional unit group may be hardware units constituted, for instance, by circuitry. The functions of the functional units may also be realized using software.

(D)

The functional status information indicating the ON/OFF state of the functional units is stored in the switching information table of the first embodiment and the examples; in lieu thereof, however, the total value range of the power consumed by the functional units may be stored. In this case a consumed power detecting unit is required for detecting the total value of consumed power, instead of a detecting unit for detecting functional unit status. Furthermore, on the basis of the total value of consumed power as detected by the consumed power detecting unit, the control unit selects the switching information and controls the ON/OFF switching of the switches.

(E)

The functional status information indicating the ON/OFF state of the functional units is stored in the switching information table of the first embodiment and the examples; frequency status information may, however, be stored in lieu thereof. Frequency status information is information indicating levels of the operating frequencies, for instance high speed, medium speed, low speed, etc. In this case, a frequency status detecting unit is required instead of a detecting unit for detecting functional unit status. The frequency status detecting unit monitors signals indicating what operating frequency is selected. On the basis of the signals detected by the frequency detecting unit, the control unit estimates the operating frequency, selects the switching information, and controls the ON/OFF switching of the switches. In this case the frequency detecting unit may be omitted in the semiconductor device.

(F)

When, with a view to limiting the total number of terminals in the package of the semiconductor device, sufficient power source input terminals cannot be secured, the methods below may be used for adjusting the impedance per wiring in the power source network:

(a) adjusting the length, thickness, material or other physical properties of the wires.

(b) mounting components inside the semiconductor device.

(c) creating wiring for adjusting impedance inside the semiconductor device.

In the first embodiment and the examples, the inductance of the power source network has been described as the inductance of the wires joining the semiconductor device package and the circuit board; however inductance is not limited thereto. Apart from these wires, such inductance may also be formed by inductance from the wiring inside the semiconductor device, etc.

INDUSTRIAL APPLICABILITY

The semiconductor device according to the present invention may be used in automobiles and/or AV equipment such as car navigation, car audio equipment or the like. By making it possible to prevent malfunctions caused by external noise, the semiconductor device of the present invention can be suitably used as a device for executing highly critical processing such as billing processing, authentication processing or the like. The semiconductor device of the present invention may be used for instance in PDAs, in mobile terminals such as cellular phones, or in on-board ETC devices in automobiles, and the like.

While only selected embodiments have been chosen to illustrate the present invention, it will be apparent to those skilled in the art from this disclosure that various changes and modifications can be made herein without departing from the scope of the invention as defined in the appended claims. Furthermore, the foregoing description of the embodiments according to the present invention are provided for illustration only, and not for the purpose of limiting the invention as defined by the appended claims and their equivalents.

What is claimed is:

1. A semiconductor device that is configured to operate at any of a plurality of predetermined frequencies, the semiconductor device comprising:

a plurality of functional units;

a power source network having a plurality of branches that supply power from a power source to said pluraity of functional units; and a plurality of switching units, each of said switching units provided along one of said pluraltiy of branches for switching ON/OFF the supply of power via the associate branch from the power source to said plurality of functional units, wherein said plurality of functional units includes:

a storage unit configured to map and store the plurality of predetermined frequencies and pieces of switching information designating on ON state or an OFF state of said switching units, the pieces of switching information being set to provide different impedance values of said power source network; and a control unit configured to read, from said storage unit, a piece of switching information corresponding to a current operating frequency of the semiconductor device, and control the ON/OFF switching of said plurality of switching units in accordance with the read piece of switching information, the pieces of switching information are set so as to keep an impedance value of said power source network within a predetermined range, for any of the plurality of predetermined frequencies at which the semiconductor device operates, said plurality of functional units further includes a frequency detecting unit configured to monitor the current operating frequency and, when the current operating frequency changes, detect a new current operating frequency after the change, and said control unit read from said storage unit a piece of switching information corresponding to the current operating frequency after change as detected by said frequency detecting unit.

2. A semiconductor device according to claim 1, wherein said switching units are connected in parallel.

3. A semiconductor device that is configured to operate at any of a plurality of predetermined frequencies, the semiconductor device comprising:

a plurality of functional units;

a power source network having a plurality of branches that supply power from a power source to said pluraity of functional units; and a plurality of switching units, each of said switching units provided along one of said pluraltiy of branches for switching ON/OFF the supply of power via the associate branch from the power source to said plurality of functional units, wherein said plurality of functional units includes:

a storage unit configured to map and store the plurality of predetermined frequencies and pieces of switching information designating on ON state or an OFF state of said switching units, the pieces of switching information being set to provide different impedance values of said power source network; and a control unit configured to read, from said storage unit, a piece of switching information corresponding to a current operating frequency of the semiconductor device, and control the ON/OFF switching of said plurality of switching units in accordance with the read piece of switching information, the pieces of switching information are set so as to keep an impedance value of said power source network within a predetermined range, for any of the plurality of predetermined frequencies at which the semiconductor device operates, said storage unit further stores pieces of functional status information designating an ON/OFF state of at least one of said plurality of functional units, the pieces of functional information being respectively mapped to the predetermined frequencies and to the pieces of switching information, and said control unit reads a piece of switching information from said storage unit in accordance with the functional status detected by said frequency status detecting unit, a piece of functional status information stored in said storage unit, and the current operating frequency.

4. A semiconductor according to claim 3, wherein the pieces of functional status information are set in accordance with criticality of processing executed in said plurality of functional units.

5. A semiconductor device according to claim 3, wherein said switching units are connected in parallel.

6. A communications terminal for communicating with at least one other terminal via a communications network, the communtcations terminal comprising:
   a semiconductor device configured to operate at any of a plurality of predetermined frequencies, the semiconductor device comprising:
      a plurality of functional units;
      a power source network having a plurality of branches connected in parallel that supply power from a power source to said pluraity of functional units; and
      a plurality of switching units connected in parallel, each of said switching units provided along one of said pluraltiy of branches for switching ON/OFF the supply of power via the associated branch from the power source to said plurality of functional units,
      wherein said plurality of functional units includes:
         a storage unit configured to map and store the plurality of predetermined frequencies and pieces of switching information designating on ON state or an OFF state of each of said switching units, the pieces of switching information being set to provide different impedance values of said power source network;
         a control unit configured to read, from said storage unit, a piece of switching information corresponding to a current operating frequency of the semiconductor device, and separately control the ON/OFF switching of said plurality of switching units in accordance with the read piece of switching information;
         a communications unit for communicating with the at least one other terminal; and
         a frequency detecting unit configured to monitor the current operating frequency and, when the current operating frequency changes, detect a new current operating frequency after the change, wherein
   said control unit reads from said storage unit a piece of switching information corresponding to the new current operating frequency after change as detected by said frequency detecting unit.

7. A communications terminal for communicating with at least one other terminal via a communications network, the communtcations terminal comprising:
   a semiconductor device configured to operate at any of a plurality of predetermined frequencies, the semiconductor device comprising:
      a plurality of functional units;
      a power source network having a plurality of branches connected in parallel that supply power from a power source to said pluraity of functional units; and
      a plurality of switching units connected in parallel, each of said switching units provided along one of said pluraltiy of branches for switching ON/OFF the supply of power via the associated branch from the power source to said plurality of functional units,
      wherein said plurality of functional units includes:
         a storage unit configured to map and store the plurality of predetermined frequencies and pieces of switching information designating on ON state or an OFF state of each of said switching units, the pieces of switching information being set to provide different impedance values of said power source network;
         a control unit configured to read, from said storage unit, a piece of switching information corresponding to a current operating frequency of the semiconductor device, and separately control the ON/OFF switching of said plurality of switching units in accordance with the read piece of switching information;
         a communications unit for communicating with the at least one other terminal; and
         a functional status detecting unit configured to detect a functional unit status indicating an ON/OFF state of at least one of said plurality of functional units, wherein
   said storage unit further stores pieces of functional status information designating an ON/OFF state of at least one of said plurality of functional units, the pieces of functional information being respectively mapped to the predetermined frequencies and to the pieces of switching information, and
   said control unit reads a piece of switching information from said storage unit in accordance with the functional status detected by said frequency status detecting unit, a piece of functional status information stored in said storage unit, and the current operating frequency.

8. A communications terminal according to claim 7, wherein the pieces of functional status information are set in accordance with criticality of processing executed in said plurality of functional units.

9. An automobile comprising:
   at least one on board device; and
   a semiconductor device comprising:
      a plurality of functional units;
      a power source network having a plurality of branches connected in parallel that supply power from a power source to said plurality of functional units; and a plurality of switching units connected in parallel, each of said switching units provided along one of said pluraltiy of branches for switching ON/OFF the supply of power via the associated branch from the power source to said plurality of functional units, wherein said plurality of functional units includes:

a storage unit configured to map and store the plurality of predetermined frequencies and pieces of switching information designating on ON state or an OFF state of each of said switching units, the pieces of switching information being set to provide different impedance values of said power source network;

a control unit configured to read, from said storage unit, a piece of switching information corresponding to a current operating frequency of the semiconductor device, and separately control the ON/OFF switching of said plurality of switching units in accordance with the read piece of switching information;

an output unit for outputting singals for controlling said at least one on-board device; and a frequency detecting unit configured to monitor the current operating frequency and, when the current operating frequency changes, detect a new current operating frequency after the change, wherein said control unit reads from said storage unit a piece of switching information corresponding to the new current operating frequency after change as detected by said frequency detecting unit.

10. An automobile comprising:

at least one on board device; and a semiconductor device comprising:

a plurality of functional units;

a power source network having a plurality of branches connected in parallel that supply power from a power source to said plurality of functional units; and a plurality of switching units connected in parallel, each of said switching units provided along one of said pluraltiy of branches for switching ON/OFF the supply of power via the associated branch from the power source to said plurality of functional units, wherein said plurality of functional units includes:

a storage unit configured to map and store the plurality of predetermined frequencies and pieces of switching information designating on ON state or an OFF state of each of said switching units, the pieces of switching information being set to provide different impedance values of said power source network;

a control unit configured to read, from said storage unit, a piece of switching information corresponding to a current operating frequency of the semiconductor device, and separately control the ON/OFF switching of said plurality of switching units in accordance with the read piece of switching information;

an output unit for outputting singals for controlling said at least one on-board device; and a functional status detecting unit configured to detect a functional unit status indicating an ON/OFF state of at least one of said plurality of functional units, wherein said storage unit further stores pieces of functional status information designating an ON/OFF state of at least one of said plurality of functional units, the pieces of functional information being respectively mapped to the predetermined frequencies and to the pieces of switching information, and said control unit reads a piece of switching information from said storage unit in accordance with the functional status detected by said frequency status detecting unit, a piece of functional status information stored in said storage unit, and the current operating frequency.

11. An automobile according to claim 10, wherein the pieces of functional status information are set in accordance with criticality of processing executed in said plurality of functional units.

\* \* \* \* \*

UNITED STATES PATENT AND TRADEMARK OFFICE
CERTIFICATE OF CORRECTION

PATENT NO. : 7,574,312 B2
APPLICATION NO. : 11/268662
DATED : August 11, 2009
INVENTOR(S) : Nakayama et al.

It is certified that error appears in the above-identified patent and that said Letters Patent is hereby corrected as shown below:

Please delete Patent 7,574,312 in its entirety and insert Patent 7,574,312 as attached.

Signed and Sealed this
Twentieth Day of September, 2011

David J. Kappos
*Director of the United States Patent and Trademark Office*

(12) United States Patent
Nakayama et al.

(10) Patent No.: US 7,574,312 B2
(45) Date of Patent: Aug. 11, 2009

(54) SEMICONDUCTOR DEVICE AND COMMUNICATIONS TERMINAL AND AUTOMOBILE HAVING THE SAME

(75) Inventors: Takeshi Nakayama, Nishinomiya (JP); Eiji Takahashi, Kashiba (JP); Yoshiyuki Saito, Katano (JP)

(73) Assignee: Panasonic Corporation, Osaka (JP)

( * ) Notice: Subject to any disclaimer, the term of this patent is extended or adjusted under 35 U.S.C. 154(b) by 344 days.

(21) Appl. No.: 11/268,662

(22) Filed: Nov. 8, 2005

(65) Prior Publication Data

US 2006/0097748 A1 May 11, 2006

(30) Foreign Application Priority Data

Nov. 8, 2004 (JP) .................... 2004-323355

(51) Int. Cl.
*G01F 23/00* (2006.01)
(52) U.S. Cl. .......................... 702/75; 701/47
(58) Field of Classification Search ............. 702/57, 702/60–63, 75, 188; 701/2, 22, 29, 36, 45, 701/47, 55–56
See application file for complete search history.

(56) References Cited

U.S. PATENT DOCUMENTS

| | | | | |
|---|---|---|---|---|
| 4,429,299 A | * | 1/1984 | Kabat et al. | 340/310.16 |
| 5,694,335 A | * | 12/1997 | Hollenberg | 726/16 |
| 6,259,972 B1 | * | 7/2001 | Sumic et al. | 700/286 |
| 6,810,340 B2 | | 10/2004 | Shimazaki et al. | 702/65 |
| 7,045,989 B2 | * | 5/2006 | Sakakibara et al. | 320/106 |
| 7,184,866 B2 | * | 2/2007 | Squires et al. | 701/33 |
| 7,254,004 B2 | * | 8/2007 | Mladenik et al. | 361/93.1 |
| 7,313,467 B2 | * | 12/2007 | Breed et al. | 701/1 |

FOREIGN PATENT DOCUMENTS

JP 2002-270695 9/2002

* cited by examiner

*Primary Examiner* — Eliseo Ramos Feliciano
*Assistant Examiner* — Mary C Baran
(74) *Attorney, Agent, or Firm* — Wenderoth, Lind & Ponack, L.L.P.

(57) ABSTRACT

A semiconductor device has improved resistance to the influence of external noise on an internal power source network. A semiconductor device operating at any of a plurality of predetermined frequencies, and having power source networks for supplying power from a power source to internal functional units in the semiconductor device includes switches, a storage unit, and a control unit. The switches are provided in the power source networks, and switch ON/OFF the supply of power from the power source to the functional units. In the storage unit are mapped and stored a plurality of predetermined operating frequencies and switching information designating an ON state or an OFF state for the switches. The control unit reads, from the storage unit, switching information corresponding to a current operating frequency, and controls the ON/OFF switching of the switches in accordance with the read switching information.

11 Claims, 6 Drawing Sheets

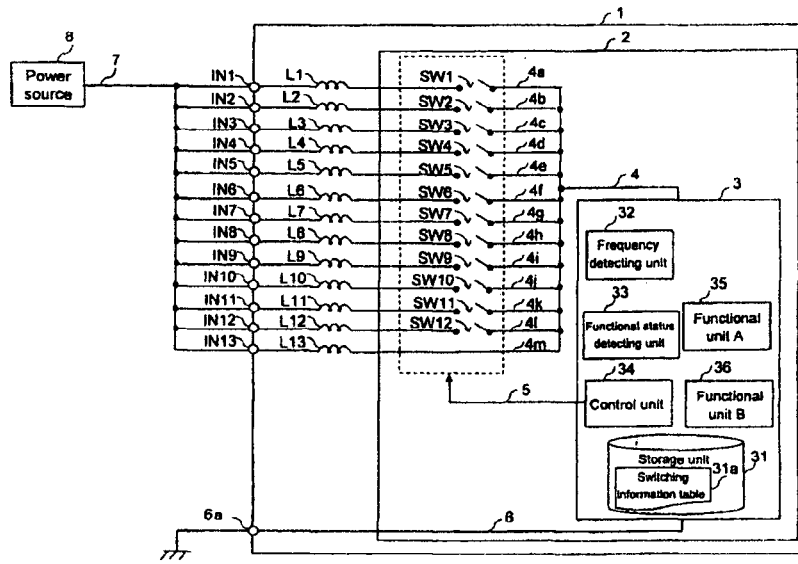

| Operating frequency | Functional status information | | Switching information | |
| --- | --- | --- | --- | --- |
| | Functional units ON | Functional units OFF | Switches ON | Switches OFF |
| 400MHz | Functional status detecting unit<br>Frequency detecting unit<br>Control unit, Storage unit<br>Functional unit A<br>Functional unit B | — | SW1~SW12 | — |
| 200MHz | Functional status detecting unit<br>Frequency detecting unit<br>Control unit, Storage unit<br>Functional unit A | Functional unit B | SW1~SW6 | SW7~SW12 |
| 10MHz | Functional status detecting unit<br>Frequency detecting unit<br>Control unit, Storage unit | Functional unit A<br>Functional unit B | — | SW1~SW12 |

31a

Fig. 2

| Operating frequency | Functional status information | | Switching information | |
|---|---|---|---|---|
| | Functional units ON | Functional units OFF | Switches ON | Switches OFF |
| 400MHz | Functional status detecting unit, Frequency detecting unit, Control unit, Communications unit, Output unit | Billing processing unit, Authentication unit | SW1~SW12 | — |
| 200MHz | Functional status detecting unit, Frequency detecting unit, Control unit, Authentication unit | Communications unit, Output unit, Billing processing unit | SW1~SW6 | SW7~SW12 |
| 10MHz | Functional status detecting unit, Frequency detecting unit, Control unit, Billing processing unit | Communications unit, Output unit, Authentication unit | — | SW1~SW12 |

*Fig. 5*

SEMICONDUCTOR DEVICE AND COMMUNICATIONS TERMINAL AND AUTOMOBILE HAVING THE SAME

BACKGROUND OF THE INVENTION

This application claims priority to Japanese Patent Application No. 2004-323355. The entire disclosure of Japanese Patent Application No. 2004-323355 is hereby incorporated herein by reference.

1. Field of the Invention

The present invention relates to a semiconductor device having resistance against the influence of external noise on internal power source networks.

2. Background Information

As a result of the rapid development of microelectronics and digital technologies in recent years, the level of integration in semiconductor devices and the speed of the operating frequencies thereof have become ever higher. However, progress in high-level integration and faster operating frequencies is handicapped by a serious problem in the form of EMS (electromagnetic susceptibility), whereby a semiconductor device is influenced by noise from outside. Noise outside the semiconductor device gets, for instance, into the power source network that supplies power to various functional units inside the semiconductor device and is transmitted to these functional units inside the semiconductor device. The noise propagated to the functional units affects signal lines and/or elements of the functional units and gives rise to malfunctions.

The propagation of noise from outside the semiconductor device is normally caused by noise currents. Noise currents flow into wiring having low impedance. Thus, when the impedance of the power source network in the semiconductor device is lower than the impedance of the wiring in the circuitry outside the semiconductor device, noise currents from outside the semiconductor device are drawn into the power source network of the semiconductor device. When noise currents flow into the power source network in the semiconductor device, power source voltage changes, affecting thereby signal lines and/or elements of the functional units.

There is, therefore, a pressing need for EMS countermeasures that shield semiconductor devices against the influence of external noise.

JP-2002-270695-A discloses a method for implementing EMS countermeasures while preserving high-level integration and fast operating frequency in a semiconductor integrated circuit. The method disclosed in JP-2002-270695-A comprises the following steps. First, impedance information is extracted from power source network inside and outside a targeted semiconductor integrated circuit. Next, equivalent circuitry is generated from the extracted impedance information. External noise waveforms are supplied as input data for the equivalent circuitry, and the influence of noise on the semiconductor integrated circuit is analyzed. If as a result of the analysis, it is judged that the semiconductor integrated circuit is influenced by external noise, external noise is absorbed, for instance, by introducing capacitors in the vicinity of power source terminals of the semiconductor integrated circuit, and/or by introducing countermeasure circuitry for eliminating noise, such as low pass filters.

Semiconductor integrated circuits usually operate at a plurality of predetermined frequencies. In the method of Patent Reference 1, however, the impedance of the power source network can only be extracted when the operating frequency is highest.

The semiconductor integrated circuit may be assumed to work, for instance, either at an operating frequency of "1 GHz" or of "300 MHz". The impedance value of the power source network is proportional to the operating frequency, since parasitic inductance of the wiring is predominant. Thus, the impedance value of the power source network when the operating frequency is "1 GHz" is higher than the impedance value of the power source network when the operating frequency is "300 MHz". When the semiconductor integrated circuit operates at a high frequency, such as "1 GHz", some phenomena, such as clock disturbance or the like, occur in the semiconductor integrated circuit as a result of a frequency characteristic. When the impedance of the power source network is lower than the impedance value outside the semiconductor integrated circuit, as when the operating frequency is "300 MHz", the power source network in the semiconductor integrated circuit is influenced by external noise outside the semiconductor integrated circuit. Thus, in the method of JP-2002-270695-A, external noise can be suppressed by introducing countermeasure circuitry, such as a low pass filter or the like, when the operating frequency is "1 GHz"; however, the method does not always afford a stable operation or eliminate phenomena such as internal clock disturbance, etc. At the operating frequency of "300 MHz", also, because noise is absorbed by the countermeasure circuitry that is set for the "1 GHz" operating frequency, external noise cannot necessarily be efficiently suppressed.

Depending on the processing executed in the semiconductor integrated circuit, there are instances that differ as to whether suppression of external noise takes precedence over operative reliability, or whether operative reliability takes precedence over suppression of external noise. However, no technology has been proposed hitherto for changing such precedence to either requirement in accordance with the processing executed in the semiconductor integrated circuit.

Thus, it is an object of the present invention to provide a semiconductor device that allows dynamic switching between operating the semiconductor device normally, or increasing resistance against the influence of external noise on the power source network of the semiconductor device, for a plurality of operating frequencies. It is also an object of the present invention to provide a communications terminal and an automobile having such a semiconductor device.

SUMMARY OF THE INVENTION

With a view of solving the above problems, a first aspect of the present invention provides a semiconductor device operating at any predetermined frequency among a plurality thereof, and having a plurality of power source networks that supply power from a power source to functional units in the semiconductor device, comprising the units below.

A switching unit is respectively provided along the plurality of power source networks for switching ON/OFF the supply of power from the power source to the functional units A storage unit is configured to map and store the plurality of predetermined frequencies and switching information designating an ON state or an OFF state of the switching unit.

A control unit is configured to read from the storage unit switching information corresponding to a current operating frequency, and control the ON/OFF switching of the switching unit in accordance with the switching information that was read.

A semiconductor device that operates at a frequency of 1 GHz or 300 MHz may be assumed. This semiconductor device has 10 power source networks that supply power from an external power source to functional units in the semiconductor device. When the semiconductor device operates at 1 GHz, the control unit carries out control so as to switch all the switching units to an ON state, in response to switching information corresponding to the frequency "1 GHz". The impedance of the power source network drops thereupon to a lower value than when at least one switching unit among the power source networks is in the OFF state, since the 10 power source networks are connected in parallel. This consequently improves phenomena such as internal clock disturbance or the like, which occur in high-frequency bands on account of the frequency characteristic, and allows the semiconductor device to operate stably. When the semiconductor device operates at 300 MHz, 3 switching units among the power source networks are switched to the ON state, while the other 7 switching units are switched to the OFF state, as instructed by the control unit in response to the switching information corresponding to the frequency "300 MHz". The impedance of the power source network rises thereupon to a higher value than when there are 4 or more power source networks having the switching unit in the ON state, since the above 3 power source networks are connected in parallel. The influence of external noise on the power source network of the semiconductor device can thereby be suppressed. That is, malfunctions caused by external noise can be suppressed in the semiconductor device.

A second aspect of the present invention provides a semiconductor device according to the first aspect of the present invention, wherein the switching information is set so as to keep the impedance value of the power source network within a predetermined range, for any frequency among the predetermined frequencies at which the semiconductor device operates.

Generally, the impedance value of the power source network is proportional to the frequency at which the semiconductor device operates. If operation of the device at a frequency of 1 GHz is compared with operation of the device at a frequency of 10 MHz, the impedance value of the power source network is higher when the semiconductor device operates at a frequency of 1 GHz than when the semiconductor device operates at a frequency of 10 MHz. A "predetermined range" refers herein to values within a range extending from, for instance, a predetermined impedance value lower than the impedance value of the power source network when the semiconductor device operates at a frequency of 1 GHz, to the impedance value of the power source network when the semiconductor device operates at a frequency of 10 MHz. Thus, the switching information for operation at a frequency of 1 GHz is determined so as to adjust the impedance value of the power source network so as not to exceed a predetermined value. The switching information for operation at a frequency of 10 MHz is set so as to adjust the impedance value of the power source network to be the highest value upon operation at 10 MHz. By keeping the impedance value of the power source network within a predetermined range, the semiconductor device acquires a capacity to suppress external noise, within a defined range, even when operating at different frequencies.

A third aspect of the present invention provides a semiconductor device according to the second aspect of the present invention, further comprising frequency detecting unit configured to monitor the current operating frequency and for, when the current operating frequency changes, detecting the operating frequency after the change. The control unit of the semiconductor device reads, from the storage unit, switching information corresponding to the current operating frequency after change that was detected by the frequency detecting unit.

The semiconductor device operates at a frequency corresponding to the current operational situation. The ON state or OFF state of the switching unit of the power source network is controlled in accordance with the operating frequency of the semiconductor device at a given time. Therefore, the impedance of the power source network is adjusted in accordance with the frequency at a given time, so that external noise from outside the semiconductor device influencing the power source network may be suppressed, or the operation of the semiconductor device may be stabilized, in accordance with the operational situation.

A fourth aspect of the present invention provides a semiconductor device according to the second aspect of the present invention, further comprising a functional status detecting unit configured to detect functional unit status indicating the ON/OFF state of at least one functional unit. Functional status information designating the ON/OFF state of at least one functional unit is further respectively mapped to the plurality of predetermined frequencies and to the switching information, and is stored in the storage unit of the semiconductor device. The control unit of the semiconductor device, furthermore, reads switching information from the storage unit on the basis of the functional status detected by the functional status detecting unit, the functional status information stored in the storage unit, and the current operating frequency.

On the basis of the current operating frequency and the functional status information, the ON/OFF state of the switching unit is changed to adjust the impedance value of the power source network in the semiconductor device to an appropriate value. For instance, if the current operating frequency is a low-frequency one and there are numerous functional units OFF, the switching units of the semiconductor device are controlled so as to switch OFF numerous switching units. The impedance value of the power source network becomes thereby higher than the impedance value of the power source network when all the switching units are in the ON state. The influence of external noise on the semiconductor device is thereby dampened. In contrast, if the current operating frequency is a high-frequency one and there are numerous functional units ON, the switching units are controlled so as to switch ON numerous switching units. The impedance value of the power source network becomes thereby lower than the impedance value of the power source network when all the switching units are in the OFF state. As a result, phenomena such as internal clock disturbance or the like can be improved, and the semiconductor device can operate stably.

A fifth aspect of the present invention is a semiconductor device according to the fourth aspect of the present invention, wherein the functional status information is set in accordance with the criticality of the processing executed in the functional units.

For example, the semiconductor device can be assumed to operate at either "400 MHz" or "10 MHz" frequencies. The lowest frequency "10 MHz" is stored as corresponding to the functional status information indicating the ON state of the functional units where processing of "high" criticality is carried out. The storage unit then stores switching information for the frequency "10 MHz", such that, when the semiconductor device operates at that frequency, the impedance of the power source network is adjusted so as to become highest. Thus, when functional units carrying out high-criticality processing are ON, the semiconductor device operates at 10 MHz, and the switching units are controlled on the basis of the switching information. The semiconductor device can therefore reliably execute high-criticality processing while suppressing the influence of external noise on the power source network.

In order to solve the aforementioned problems, a sixth aspect of the present invention further provides a communications terminal characterized by comprising the semiconductor device according to the first aspect of the present invention, for communicating with other terminals via a communications network. The semiconductor device comprises, as one of the functional units, a communications unit whereby the communications terminal communicates with other terminals.

In the semiconductor device of the first aspect of the present invention, the state of the internal power source network is changed on the basis of the current operating frequency, so as to adjust the impedance of the power source network to an appropriate value. The influence of noise outside the semiconductor device upon the power source network is thereby suppressed. The semiconductor device according to the first aspect of the present invention may thus be used as a semiconductor device in a communications terminal. For instance, if high-criticality processing such as billing processing is processed on the communications terminal, the frequency in the semiconductor device is lowered and the ON/OFF states of the switching unit are switched so as to increase the wiring impedance of the power source. The influence of noise outside the semiconductor device upon the power source network is thereby suppressed while processing is being executed. The communications terminal can thus execute processing reliably and without malfunction.

In order to solve the aforementioned problems, a seventh aspect of the present invention provides an automobile having on-board equipment comprising the semiconductor device according to the first aspect of the present invention. The semiconductor device comprises, as one of the functional units, an output unit for outputting signals for controlling the on-board equipment.

In the semiconductor device of the first aspect of the present invention, the state of the power source network is changed on the basis of the operating frequency so as to adjust the impedance of the power source network to an appropriate value. The influence of noise outside the semiconductor device upon the power source network is thereby suppressed. The semiconductor device according to the first aspect of the present invention may thus be used as a semiconductor device for controlling various devices installed in an automobile. As a result, the power source network in the semiconductor device remains unaffected even by electromagnetic fields emanating from on-board equipment, for instance from an engine or the like. The operation of the semiconductor device is thus trouble-free. The automobile having the semiconductor device according to the first aspect of the present invention is therefore safe, with no malfunctions or the like.

The present invention allows a semiconductor device to operate normally or allows increasing resistance against the influence of external noise on the power source network of a semiconductor device, for a plurality of operating frequencies.

These and other objects, features, aspects and advantages of the present invention will become apparent to those skilled in the art from the following detailed description, which, taken in conjunction with the annexed drawings, discloses a preferred embodiment of the present invention.

BRIEF DESCRIPTION OF THE DRAWINGS

Referring now to the attached drawings which form a part of this original disclosure:

FIG. 1 is a diagram illustrating the overall constitution of a semiconductor device according to a first embodiment and the connections thereof with peripheral devices.

FIG. 2 is a switching information table stored in a storage unit according to the first embodiment.

FIG. 3 is a block diagram of a communications terminal in an example.

FIG. 4 is a connection diagram of a semiconductor device in an example and a wiring diagram thereof with peripheral devices.

FIG. 5 is a switching information table stored in the storage unit in an example.

FIG. 6 is a conceptual diagram of a semiconductor device according to another example used in an automobile.

DETAILED DESCRIPTION OF THE PREFERRED EMBODIMENTS

First Embodiment

FIG. 1 is a diagram illustrating the overall constitution of a semiconductor device according to a first embodiment and the connections thereof with peripheral devices. This semiconductor device is used as a semiconductor device for controlling, for example, cellular telephones, communications terminals such as on-board ETC (Electronic Toll Collection) systems, various devices in automobiles or the like. The semiconductor device 1 in FIG. 1 is connected to an external power source 8 through a wiring 7. The power source 8 supplies power to the semiconductor device 1.

(1) Constitution of the Semiconductor Device

The semiconductor device 1 of FIG. 1 comprises a printed circuit board 2, with circuitry printed thereon, and a semiconductor package covering the former. The semiconductor package comprises a plurality of input terminals IN1-IN13 and a GND terminal 6a.

On the printed circuit board 2 is provided circuitry comprising a functional unit group 3, comprised of various functional units 31-36, a power source network 4, and switches SW1-SW12 (which correspond to switching unit). The functional units 31-36 in the functional unit group 3 are explained below. The power source network 4 connects the functional unit group 3 with the switches SW1-SW12. Specifically, one power source network 4 extending from the connection side of the functional unit group 3, braches out and connects to one terminal each of the switches SW1-SW12. The branched power source network 4 will be referred to hereinafter as "the branch wirings 4a-4m". The switches SW1-SW12 are connected in parallel by the branch wirings 4a-4l. The other terminals of the switches SW1-SW12 are connected to the input terminals IN1-IN12 of the semiconductor package. The switches SW1-SW12 switch ON/OFF the supply of power to the functional units 31-36, from the power source 8, which is external to the semiconductor device 1. The branch wiring 4m comprises no switch and is thus directly connected to an input terminal IN13. Accordingly, power from the power source 8 is supplied via the branch wiring 4m to the functional units 31-36, even when all the switches SW1-SW12 are switched OFF. The method for connecting the other terminals of the switches SW1-SW12 to the input terminals of the semiconductor package may be for instance a wire-bonding method, a wireless-bonding method or the like. In the present embodiment, for instance, wire bonding is used. Specifically, the switches SW1-SW12 and the input terminals IN1-IN12, and the branch wiring 4m and the input terminal IN13, are connected by wires. In FIG. 1, L1-L12 are inductances of the wires connecting the switches SW1-SW12 and the input terminals IN1-IN12. L13 is the inductance of a wire connecting the branch wiring 4m and the input terminal IN13.

On the printed circuit board 2 is further provided a wiring 5 and a wiring 6. The wiring 5 connects the switches SW1-SW12 to a control unit 34, described below, in the functional unit group 3. The wiring 6 connects the functional units 31-36 in the functional unit group 3 to the GND terminal 6a of the semiconductor package. The GND terminal 6a is connected to a ground outside the semiconductor device 1.

(2) Constitution of the Functional Unit Group

The constitution of the functional unit group 3 is explained next. The functional unit group 3 comprises a storage unit 31, a frequency detecting unit 32, a functional status detecting unit 33, a control unit 34, a functional unit A 35, and a functional unit B 36. The functional unit A 35 and the functional unit B 36 have arbitrary functions. The main functional units are explained next.

(2-1) Storage Unit

FIG. 2 is a diagram illustrating the concept of a switching information table 31a stored in the storage unit 31. An operating frequency, functional status information, and switching information are stored as one record in the switching information table 31a of FIG. 2. The operating frequency is the predetermined frequency at which the semiconductor device 1 operates. The switching information is information designating the ON-state or OFF-state of the switches SW1-SW12. The functional status information is information designating the ON/OFF state of at least one functional unit.

For instance, the functional status information corresponding to operating frequency "200 MHz" designates an OFF state only for the functional unit B 36, and an ON state for the other functional units 31-35. The corresponding switching information designates that the switches SW1-SW6 are ON, while the other switches SW7-SW12 are OFF. The method for setting the switching information in the switching information table 31a is described below.

Though functional status information is stored in the switching information table 31a of FIG. 2, functional status information becomes unnecessary if the ON/OFF of each functional unit 31-36 is coupled with the operating frequency of the semiconductor device 1. At least the operating frequency and the switching information should be mapped and recorded in the switching information table 31a.

(2-2) Frequency Detecting Unit

The frequency detecting unit 32 monitors the current operating frequency of the semiconductor device 1. When the operating frequency changes, the frequency detecting unit 32 detects the operating frequency after change and transmits it to the control unit 34.

(2-3) Functional Status Detecting Unit

The functional status detecting unit 33 detects a functional unit status indicating the ON/OFF state of at least one functional unit in the functional unit group 3. The functional status detecting unit 33 notifies the control unit 34 of the detected ON/OFF state of the functional unit(s).

(2-4) Control Unit

Upon receiving the current operating frequency detected by the frequency detecting unit 32, and the functional status detected by the functional status detecting unit 33, the control unit 34 searches the switching information table 31a for the corresponding operating frequency and functional status information. The control unit 34 reads the switching information hits resulting from the search. The control unit 34 then controls the ON/OFF switching of the switches SW1-SW12 in accordance with the switching information that has been read. Specifically, the control unit 34 generates, on the basis of the switching information that has been read, a signal for controlling the switches SW1-SW12, which is sent via the wiring 5 to the switches SW1-SW12.

The control unit 34 may also control the switches SW1-SW12 by reading from the switching information table 31a the switching information corresponding to the operating frequency after a change.

(3) Method for Setting the Switching Information

The method for setting the switching information in the switching information table 31a of FIG. 2 is described next. The switching information is set in such a way that the value of the total impedance of the entirety of the branch wirings 4a-4m falls within a predetermined range, regardless of the operating frequency at which the semiconductor device 1 operates. The entirety of the branch power source networks 4a-4m will be referred to hereinafter as "the entire power source network".

Impedance Z in each of the branch wirings 4a-4m can ordinarily be derived from the formula below, assuming that parasitic impedance of the wiring is predominant:

$$Z = 2\pi f L$$

L is the inductance value per wiring of the branch wirings 4a-4m, mainly the inductance value of the wires. The value of L varies depending on the type of wires used, among other factors. In the present embodiment the inductance L is assumed to be 1nF.

f is the frequency of an odd harmonic of the operating frequency. The reason for using harmonic frequencies for f is briefly explained. An internal clock for operating the functional units 31-36 is generated in the semiconductor device 1. The internal clock is generated through charge and discharge of electrical currents flowing through the power source network 4 to capacitors provided inside the semiconductor device 1. These currents contain frequency components of the operating frequency of the generated internal clock, and/or frequency components of even harmonics of the operating frequency. Among frequency components in the currents, the frequency components of odd harmonics of the operating frequency, in particular, are large enough that they cannot be neglected. For this reason, odd harmonic frequencies of the operating frequency are used for f in the above formula when determining the inductance value per wiring in the branch wirings 4a-4m. In the present embodiment, for instance, a $5^{th}$ harmonic of the operating frequency is used as f.

First, the impedance Z per wiring of the branch wirings 4a-4m is calculated based on the above formula for each operating frequency in the switching information table 31a at which the semiconductor device 1 operates. If the operating frequency is "400 MHz", the frequency f of the $5^{th}$ harmonic is "2 GHz". The impedance Z per wiring of the branch wirings 4a-4m is thus "12.56 Ω". Similarly, when the operating frequency is "200 MHz" and "10 MHz", the impedance Z per wiring of the branch wirings 4a-4m is "6.28 Ω" and "0.314 Ω", respectively.

The number of necessary branch wirings 4a-4m is next calculated on the basis of the impedance Z per wiring of the branch wirings 4a-4m calculated above, with a view of keeping the impedance of the entire power source network 4, for each operating frequency, within a predetermined range. The "predetermined range" herein is set to impedance values that allow the influence of noise from outside the semiconductor device 1 to be suppressed, even at the lowest operating frequency of "10 MHz", and that afford correct operation also at the highest operating frequency of "400 MHz", with no internal clock disturbance. In the present embodiment the predetermined range is "1 Ω to 0.314 Ω". The number of necessary branch wirings 4a-4m is adjusted so as to keep the impedance of the entire power source network 4 within 1 Ω to 0.314 Ω, for each operating frequency.

For instance, if the impedance Z of one of the branch wirings 4a-4m is "R", the total impedance of n branch wirings 4a-4m connected in parallel, i.e., the impedance of the entire power source network 4, is "R/n". To keep the impedance of the entire power source network 4 at or below 1 Ω, there must be at least R branch wirings 4a-4m (n≧R). Specifically, when the operating frequency is "400 MHz", the impedance Z per wiring of the branch wirings 4a-4m is "12.56 Ω", and in consequence at least 13 branch wirings 4a-4m are required for the impedance of the entire power source network 4 to be 1 Ω or less. Similarly, when the operating frequency is "200 MHz", at least 7 branch wirings 4a-4m are required. When the operating frequency is "10 MHz", the impedance Z per wiring of the branch wirings 4a-4m is "0.314 Ω". By connecting in parallel one or more branch wirings 4a-4m, the impedance of the entire power source network 4 thus becomes less than "0.314 Ω". Accordingly, the branch wirings 4a-4m can be then reduced to one wire. In the present embodiment the number of necessary branch wirings 4a-4m is kept to a minimum. That is, 13 branch wirings 4a-4m are required for an operating frequency of "400 MHz", and 7 branch wirings 4a-4m for an operating frequency of "200 MHz".

Switching information is set on the basis of the number of necessary branch wirings 4a-4m determined as explained above. Since 13 branch wirings 4a-4m are required for an operating frequency of "400 MHz", the switching information designates in this case an ON state for all the switches SW1-SW12. Similarly, the switching information for an operating frequency of "200 MHz" designates for instance an ON state for the switches SW1-SW6, and an OFF state for the switches SW7-SW12. The switching information for an operating frequency of "10 MHz" designates an OFF state for all the switches SW1-SW12. That is so because no switch is provided on the single branch wiring 4m.

The ON/OFF state of the switches SW1-SW12 is changed in the semiconductor device 1 on the basis of the frequency and the status of the functional units 31-36, in such a way as to keep the impedance of the entire power source network 4 within a predetermined range, for any operating frequency of the semiconductor device 1. This confers the semiconductor device 1 a capability of restricting external noise to a suitable range, for any operating frequency among a plurality thereof at which the semiconductor device 1 is operating. The semiconductor device 1 can therefore suppress malfunctions caused by external noise. When the operating frequency is high, in particular, the impedance per wiring of the branch wirings 4a-4m increases, and the impedance of the entire power source network 4 is thus lowered by switching ON the switches in the branch wirings 4a-4m. Consequently, at high operating frequencies, the semiconductor device 1 can operate stably, improving among other phenomena internal clock disturbance, resulting from the frequency characteristic.

EXAMPLES

Next, an example of the above first embodiment of the semiconductor device used in a communications terminal is described. The communications terminal in the present example communicates with other terminals via a communications network. The present example relates to a communications terminal in which billing and/or authentication processing is carried out.

(1) Constitution of the Communications Terminal and the Semiconductor Device

FIG. 3 is a block diagram of a communications terminal 151 according to the present embodiment. The communications terminal 151 in FIG. 3 comprises a process start button 152, a display unit 153, a communications interface 154, a semiconductor device 101, and a power source 111. The process start button 152 receives, from the user, instructions for executing billing and/or authentication processing. Progress and results of the billing/authentication process being executed are displayed in the display unit 153. The semiconductor device 101 controls and processes communications with the other terminals via the communications interface 154. The power source 111 supplies power to the semiconductor device 101 and the display unit 153.

FIG. 4 is a diagram illustrating the overall constitution of a semiconductor device 101 according to the present example and the connections thereof with peripheral devices. The semiconductor device 101 further comprises wirings 107-109 and I/O terminals 107a-109a. The wiring 107 connects the process start button 152 with a functional group 103 described below, and processing instructions for the functional group 103 are input to the input terminal 107a. The wiring 108 connects the display unit 153 to an output unit 135 described below, and the output signals of the output unit 135 are outputted through an output terminal 108a. The wiring 109 connects a communications unit 136 described below with the communications interface 154, with signals being input/output between the communications unit 136 and the communications interface 154 via an I/O terminal 109a.

The rest of the overall constitution of the semiconductor device 101 is identical to that of the first embodiment. That is, the semiconductor device 101 comprises a printed circuit board 102 and a semiconductor package provided thereon. On the printed circuit board 102 is provided circuitry comprising a functional unit group 103 that comprises various functional units 131-138, a power source network 104, and switches SW1-SW12. On the semiconductor package are provided input terminals IN1-IN13 and a GND terminal 106a. The power source network 104 is branched to connect the functional unit group 103 with one terminal of each switch SW1-SW12. The branched power source network 104 will be referred to hereinafter as "the branch wirings 104a-104m". The switches SW1-SW12 are connected in parallel by the branch wirings 104a-104l. The other terminals of the switches SW1-SW12 are connected by wires to the input terminals IN1-IN12 of the semiconductor package. The branch wiring 104m is connected directly to the input terminal IN13. The input terminals IN1-IN13 are connected through a wiring 110 with the power source 111 outside the semiconductor device 101. On the printed circuit board 102 are further provided a wiring 105 and a wiring 106. The wiring 105 connects a control unit 134, described below, with the switches SW1-SW12. The wiring 106 connects the functional units 131-138 in the functional unit group 103 to the GND terminal 106a of the semiconductor package. The GND terminal 106a is connected to a ground, which is exterior to the semiconductor device 101.

(2) Constitution of the Functional Unit Group

The constitution of the functional unit group 103 is explained next. The functional unit group 103 comprises a storage unit 131, a frequency detecting unit 132, a functional status detecting unit 133, a control unit 134, an output unit 135, a communications unit 136, a billing processing unit 137 and an authentication unit 138. The output unit 135, the communications unit 136, the billing processing unit 137 and the authentication unit 138 in the semiconductor device 101 of the present example correspond to the functional unit A 35 and the functional unit B 36 of the functional unit group 3 in the first embodiment.

In the storage unit 131 is stored a switching information table 131a. FIG. 5 is conceptual diagram illustrating the switching information table 131a. As in the switching information table of FIG. 2, the operating frequency, functional state information and switching information are stored as one record in the switching information table 131a of FIG. 5. For instance, the functional status information for the operating frequency "10 MHz" indicates that the billing processing unit 137 is ON, while the output unit 135, the communications unit 136 and the authentication unit 138 are OFF. It should be noted that the frequency detecting unit 132, the functional status detecting unit 133 and the control unit 134 are always ON. The switching information for this case designates an OFF state for all the switches SW1-SW12.

The frequency detecting unit 132 monitors the operating frequency at which the semiconductor device 101 is currently operating; if the operating frequency changes, the frequency detecting unit 132 detects the operating frequency after the change.

The functional status detecting unit 133 detects a functional status indicating the ON/OFF state of the functional units 131-138 in the functional unit group 103.

On the basis of the current operating frequency and the functional status detected by the frequency detecting unit 132 and the functional status detecting unit 133, respectively, the control unit 134 reads switching information from the switching information table 131a stored in the storage unit 131. The control unit 134 controls the switches SW1-SW12 based on the switching information that has been read.

The output unit 135 outputs the progress and results of the processing being executed in the billing processing unit 137 and the authentication unit 138.

The communications unit 136 sends and receives data to and from other terminals via a communications network.

The billing processing unit 137 executes billing processing upon receiving a billing processing instruction from the process start button 152.

The authentication unit 138 executes authentication processing upon receiving an authentication processing instruction from the process start button 152.

(3) Relationship Between Processing and Functional Status Information

The relationship between the functional status information and the operating frequency in the switching information table 131a of FIG. 5 is described next. The functional status information in the switching information table 131a of the present example is set in accordance with the criticality of processing being executed in the functional units.

For instance, billing processing may be assumed to be of "high" criticality as a communications processing standard. In the present example, "high-criticality" billing is processed at the lowest operating frequency "10 MHz" so as to execute the process reliably and avoid malfunctions caused by noise from outside the semiconductor device 101. When the operating frequency is "10 MHz", all the switches SW1-SW12 are switched OFF to yield a single branch wiring. The impedance of the entire power source network 104 becomes maximal when the operating frequency is "10 MHz". The semiconductor device 101 can thus suppress external noise and execute malfunction-free billing processing.

It should be noted that the switching information is set for each operating frequency, in the same way as in the first embodiment.

The functional status information is established in accordance with the criticality of the processing performed by the functional units that are ON. High-criticality processing is carried out for instance at a low operating frequency. In such a case, the impedance of the entire power source network 104 is lower than the impedance of the entire power source network 104 when processing is carried out at a high operating frequency; when the operating frequency is low, processing is carried out with the highest impedance of the entire power source network 104. The semiconductor device 101 can therefore execute processing reliably, suppressing the influence that noise outside the device has on the power source network.

In general, the power consumed in the semiconductor device 101 is proportional to the square of the operating frequency. Power consumption in the semiconductor device 101 can be reduced, therefore, by lowering the operating frequency thereof. As a result, the semiconductor device 101 according to the present invention can be incorporated into a communications terminal 151 that requires low power consumption. The entire power consumption of the communications terminal 151 can thus be lowered.

OTHER EXAMPLES (A)
FIG. 6 is a conceptual diagram of the constitution of functional units in an automobile, using as semiconductor devices installed in the automobile the semiconductor device 1 according to the first embodiment of the present invention. An automobile 201 in FIG. 6 has an ETC on-board device 211, a transmission 214, an engine 216 and a vehicle air conditioner 217. The semiconductor devices A 212 and D 218 of the first embodiment are installed respectively on the ETC on-board device 211 and the vehicle air conditioner 217. The automobile 201 comprises also a semiconductor device B 213 for mission control and a semiconductor device C 215 for engine control according to the first embodiment. Semiconductor devices A-D 212, 213, 215, 218 comprise outputs units for outputting signals for controlling the ETC on-board device 211, the transmission 214, the engine 216, and the vehicle air conditioner 217, respectively.

The engine 216 radiates strong electromagnetic fields, and therefore the semiconductor devices A-D 212, 213, 215, and 218 are used so that the power source network in the semiconductor devices is little affected by the electromagnetic fields radiated by the engine 216. The semiconductor devices A-D 212, 213, 215, and 218 can thus operate stably and can output signals for controlling the various devices. An automobile that incorporates the semiconductor device 1 of the first embodiment is thus safe and malfunction-free.

(B)
In the first embodiment, the control unit 34 controls the switches SW1-SW12, but it may also control the ON/OFF switching of the functional units 31-36 in addition to the control of the switches SW1-SW12. On the basis of the current operating frequency as detected by the frequency detecting unit 32, the control unit 34 may then additionally read the corresponding functional status information from the switching information table 31a.

In addition to controlling the switches SW1-SW12, the control unit 34 may also change the operating frequency. On the basis of the ON/OFF state of the functional units 31-36 as detected by the functional status detecting unit 33, the control unit 34 may then additionally read the corresponding frequency from the switching information table 31a. It should be noted that the timing at which the functional status detecting unit 33 starts detecting the ON/OFF state of the functional units 31-36 may be, for instance, the timing at which processing instructions are received from the device in which the semiconductor device 1 is installed.

(C)

In the first embodiment and the examples, the functional units in the functional unit group may be hardware units constituted, for instance, by circuitry. The functions of the functional units may also be realized using software.

(D)

The functional status information indicating the ON/OFF state of the functional units is stored in the switching information table of the first embodiment and the examples; in lieu thereof, however, the total value range of the power consumed by the functional units may be stored. In this case, a consumed power detecting unit is required for detecting the total value of consumed power, instead of a detecting unit for detecting functional unit status. Furthermore, on the basis of the total value of consumed power as detected by the consumed power detecting unit, the control unit selects the switching information and controls the ON/OFF switching of the switches.

(E)

The functional status information indicating the ON/OFF state of the functional units is stored in the switching information table of the first embodiment and the examples; frequency status information may, however, be stored in lieu thereof. Frequency status information is information indicating levels of the operating frequencies, for instance high speed, medium speed, low speed, etc. In this case, a frequency status detecting unit is required instead of a detecting unit for detecting functional unit status. The frequency status detecting unit monitors signals indicating what operating frequency is selected. On the basis of the signals detected by the frequency status detecting unit, the control unit estimates the operating frequency, selects the switching information, and controls the ON/OFF switching of the switches. In this case the frequency detecting unit may be omitted in the semiconductor device.

(F)

When, with a view to limiting the total number of terminals in the package of the semiconductor device, sufficient power source input terminals cannot be secured, the methods below may be used for adjusting the impedance per wiring in the power source network:

(a) adjusting the length, thickness, material or other physical properties of the wires.

(b) mounting components inside the semiconductor device.

(c) creating wiring for adjusting impedance inside the semiconductor device.

In the first embodiment and the examples, the inductance of the power source network has been described as the inductance of the wires joining the semiconductor device package and the circuit board; however inductance is not limited thereto. Apart from these wires, such inductance may also be formed by inductance from the wiring inside the semiconductor device, etc.

INDUSTRIAL APPLICABILITY

The semiconductor device according to the present invention may be used in automobiles and/or AV equipment such as car navigation, car audio equipment or the like. By making it possible to prevent malfunctions caused by external noise, the semiconductor device of the present invention can be suitably used as a device for executing highly critical processing such as billing processing, authentication processing or the like. The semiconductor device of the present invention may be used for instance in PDAs, in mobile terminals such as cellular phones, or in on-board ETC devices in automobiles, and the like.

While only selected embodiments have been chosen to illustrate the present invention, it will be apparent to those skilled in the art from this disclosure that various changes and modifications can be made herein without departing from the scope of the invention as defined in the appended claims. Furthermore, the foregoing description of the embodiments according to the present invention are provided for illustration only, and not for the purpose of limiting the invention as defined by the appended claims and their equivalents.

What is claimed is:

1. A semiconductor device that is configured to operate at any of a plurality of predetermined frequencies, the semiconductor device comprising:

a plurality of functional units;

a power source network having a plurality of branches that supply power from a power source to said plurality of functional units; and a plurality of switching units, each of said switching units provided along one of said plurality of branches for switching ON/OFF the supply of power via the associate branch from the power source to said plurality of functional units, wherein said plurality of functional units includes:

a storage unit configured to map and store the plurality of predetermined frequencies and pieces of switching information designating an ON state or an OFF state of said switching units, the pieces of switching information being set to provide different impedance values of said power source network; and a control unit configured to read, from said storage unit, a piece of switching information corresponding to a current operating frequency of the semiconductor device, and control the ON/OFF switching of said plurality of switching units in accordance with the read piece of switching information, the pieces of switching information are set so as to keep an impedance value of said power source network within a predetermined range, for any of the plurality of predetermined frequencies at which the semiconductor device operates, said plurality of functional units further includes a frequency detecting unit configured to monitor the current operating frequency and, when the current operating frequency changes, detect a new current operating frequency after the change, and said control unit read from said storage unit a piece of switching information corresponding to the current operating frequency after change as detected by said frequency detecting unit.

2. A semiconductor device according to claim 1, wherein said switching units are connected in parallel.

3. A semiconductor device that is configured to operate at any of a plurality of predetermined frequencies, the semiconductor device comprising:

a plurality of functional units;

a power source network having a plurality of branches that supply power from a power source to said plurality of functional units; and a plurality of switching units, each of said switching units provided along one of said plurality of branches for switching ON/OFF the supply of power via the associate branch from the power source to said plurality of functional units, wherein said plurality of functional units includes:

a storage unit configured to map and store the plurality of predetermined frequencies and pieces of switching information designating an ON state or an OFF state of said switching units, the pieces of switching information being set to provide different impedance values of said power source network; and a control unit configured to read, from said storage unit, a piece of switching information corresponding to a current operating frequency of the semiconductor device, and control the ON/OFF switching of said plurality of switching units in accordance with the read piece of switching information, the pieces of switching information are set so as to keep an impedance value of said power source network within a predetermined range, for any of the plurality of predetermined frequencies at which the semiconductor device operates, said storage unit further stores pieces of functional status information designating an ON/OFF state of at least one of said plurality of functional units, the pieces of functional information being respectively mapped to the predetermined frequencies and to the pieces of switching information, and said control unit reads a piece of switching information from said storage unit in accordance with the functional status detected by said frequency status detecting unit, a piece of functional status information stored in said storage unit, and the current operating frequency.

4. A semiconductor according to claim 3, wherein the pieces of functional status information are set in accordance with criticality of processing executed in said plurality of functional units.

5. A semiconductor device according to claim 3, wherein said switching units are connected in parallel.

6. A communications terminal for communicating with at least one other terminal via a communications network, the communications terminal comprising:

a semiconductor device configured to operate at any of a plurality of predetermined frequencies, the semiconductor device comprising:

a plurality of functional units;

a power source network having a plurality of branches connected in parallel that supply power from a power source to said plurality of functional units; and a plurality of switching units connected in parallel, each of said switching units provided along one of said plurality of branches for switching ON/OFF the supply of power via the associated branch from the power source to said plurality of functional units, wherein said plurality of functional units includes:

a storage unit configured to map and store the plurality of predetermined frequencies and pieces of switching information designating an ON state or an OFF state of each of said switching units, the pieces of switching information being set to provide different impedance values of said power source network;

a control unit configured to read, from said storage unit, a piece of switching information corresponding to a current operating frequency of the semiconductor device, and separately control the ON/OFF switching of each of said plurality of switching units in accordance with the read piece of switching information;

a communications unit for communicating with the at least one other terminal; and a frequency detecting unit configured to monitor the current operating frequency and, when the current operating frequency changes, detect a new current operating frequency after the change, wherein said control unit reads from said storage unit a piece of switching information corresponding to the new current operating frequency after change as detected by said frequency detecting unit.

7. A communications terminal for communicating with at least one other terminal via a communications network, the communications terminal comprising:

a semiconductor device configured to operate at any of a plurality of predetermined frequencies, the semiconductor device comprising:

a plurality of functional units;

a power source network having a plurality of branches connected in parallel that supply power from a power source to said plurality of functional units; and a plurality of switching units connected in parallel, each of said switching units provided along one of said plurality of branches for switching ON/OFF the supply of power via the associated branch from the power source to said plurality of functional units, wherein said plurality of functional units includes:

a storage unit configured to map and store the plurality of predetermined frequencies and pieces of switching information designating an ON state or an OFF state of each of said switching units, the pieces of switching information being set to provide different impedance values of said power source network;

a control unit configured to read, from said storage unit, a piece of switching information corresponding to a current operating frequency of the semiconductor device, and separately control the ON/OFF switching of each of said plurality of switching units in accordance with the read piece of switching information;

a communications unit for communicating with the at least one other terminal; and a functional status detecting unit configured to detect a functional unit status indicating an ON/OFF state of at least one of said plurality of functional units, wherein said storage unit further stores pieces of functional status information designating an ON/OFF state of at least one of said plurality of functional units, the pieces of functional information being respectively mapped to the predetermined frequencies and to the pieces of switching information, and said control unit reads a piece of switching information from said storage unit in accordance with the functional status detected by said frequency status detecting unit, a piece of functional status information stored in said storage unit, and the current operating frequency.

8. A communications terminal according to claim 7, wherein the pieces of functional status information are set in accordance with criticality of processing executed in said plurality of functional units.

9. An automobile comprising:

at least one on board device; and a semiconductor device comprising:

a plurality of functional units;

a power source network having a plurality of branches connected in parallel that supply power from a power source to said plurality of functional units; and a plurality of switching units connected in parallel, each of said switching units provided along one of said plurality of branches for switching ON/OFF the supply of power via the associated branch from the power source to said plurality of functional units, wherein said plurality of functional units includes:
a storage unit configured to map and store the plurality of predetermined frequencies and pieces of switching information designating an ON state or an OFF state of each of said switching units, the pieces of switching information being set to provide different impedance values of said power source network;
a control unit configured to read, from said storage unit, a piece of switching information corresponding to a current operating frequency of the semiconductor device, and separately control the ON/OFF switching of each of said plurality of switching units in accordance with the read piece of switching information;
an output unit for outputting signals for controlling said at least one on-board device; and
a frequency detecting unit configured to monitor the current operating frequency and, when the current operating frequency changes, detect a new current operating frequency after the change, wherein
said control unit reads from said storage unit a piece of switching information corresponding to the new current operating frequency after change as detected by said frequency detecting unit.

10. An automobile comprising:
at least one on board device; and
a semiconductor device comprising:
a plurality of functional units;
a power source network having a plurality of branches connected in parallel that supply power from a power source to said plurality of functional units; and
a plurality of switching units connected in parallel, each of said switching units provided along one of said plurality of branches for switching ON/OFF the supply of power via the associated branch from the power source to said plurality of functional units, wherein said plurality of functional units includes:
a storage unit configured to map and store the plurality of predetermined frequencies and pieces of switching information designating an ON state or an OFF state of each of said switching units, the pieces of switching information being set to provide different impedance values of said power source network;
a control unit configured to read, from said storage unit, a piece of switching information corresponding to a current operating frequency of the semiconductor device, and separately control the ON/OFF switching of said plurality of switching units in accordance with the read piece of switching information;
an output unit for outputting signals for controlling said at least one on-board device; and
a functional status detecting unit configured to detect a functional unit status indicating an ON/OFF state of at least one of said plurality of functional units, wherein
said storage unit further stores pieces of functional status information designating an ON/OFF state of at least one of said plurality of functional units, the pieces of functional information being respectively mapped to the predetermined frequencies and to the pieces of switching information, and
said control unit reads a piece of switching information from said storage unit in accordance with the functional status detected by said functional status detecting unit, a piece of functional status information stored in said storage unit, and the current operating frequency.

11. An automobile according to claim 10, wherein the pieces of functional status information are set in accordance with criticality of processing executed in said plurality of functional units.

* * * * *